(12) United States Patent
Yeon et al.

(10) Patent No.: US 12,507,574 B2
(45) Date of Patent: Dec. 23, 2025

(54) DISPLAY DEVICE AND METHOD FOR MANUFACTURING THE SAME

(71) Applicant: Samsung Display Co., LTD., Yongin-si (KR)

(72) Inventors: Eun-Kyung Yeon, Yongin-si (KR); Hyunkyung Yun, Yongin-si (KR); Sangduk Lee, Yongin-si (KR); Hoikwan Lee, Yongin-si (KR); Hayoung Choi, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 441 days.

(21) Appl. No.: 18/132,220

(22) Filed: Apr. 7, 2023

(65) Prior Publication Data

US 2023/0403907 A1    Dec. 14, 2023

(30) Foreign Application Priority Data

Jun. 10, 2022    (KR) .......................... 10-2022-0071016

(51) Int. Cl.
*H10K 59/80*    (2023.01)
*H10K 71/00*    (2023.01)

(52) U.S. Cl.
CPC ......... *H10K 59/87* (2023.02); *H10K 59/8792* (2023.02); *H10K 71/00* (2023.02)

(58) Field of Classification Search
CPC .... H10K 59/87; H10K 59/8792; H10K 71/00; H10K 50/844; H10K 59/126; H10K 77/111
See application file for complete search history.

(56) References Cited

U.S. PATENT DOCUMENTS

| | | | |
|---|---|---|---|
| 10,290,685 B2 | 5/2019 | Oh et al. | |
| 10,658,615 B2 | 5/2020 | Oh et al. | |
| 2017/0260425 A1* | 9/2017 | Yamamoto | B32B 27/34 |
| 2020/0019266 A1* | 1/2020 | Ohtsuki | G06F 1/1643 |
| 2020/0136069 A1* | 4/2020 | Paek | H10K 59/8794 |
| 2021/0399257 A1* | 12/2021 | Hwang | G06F 3/0443 |
| 2023/0225153 A1* | 7/2023 | Choi | H10K 50/865 257/40 |
| 2025/0089449 A1* | 3/2025 | Hwang | H10K 59/871 |

FOREIGN PATENT DOCUMENTS

| | | | |
|---|---|---|---|
| JP | 2009103833 A | 5/2009 | |
| KR | 1020170132398 A | 12/2017 | |
| KR | 1020180098445 A | 9/2018 | |

* cited by examiner

*Primary Examiner* — J.E. Schoenholtz
(74) *Attorney, Agent, or Firm* — CANTOR COLBURN LLP

(57) ABSTRACT

A method for manufacturing a display device includes: preparing a display panel including a first region, a bending region, and a second region, which are arranged in a first direction; disposing a release film overlapping the bending region on the display panel; applying a resin onto the first region to form a resin coating layer; pressing the resin coating layer, using a stamp coated with a release material; and curing the resin coating layer to form a preliminary resin layer.

20 Claims, 19 Drawing Sheets

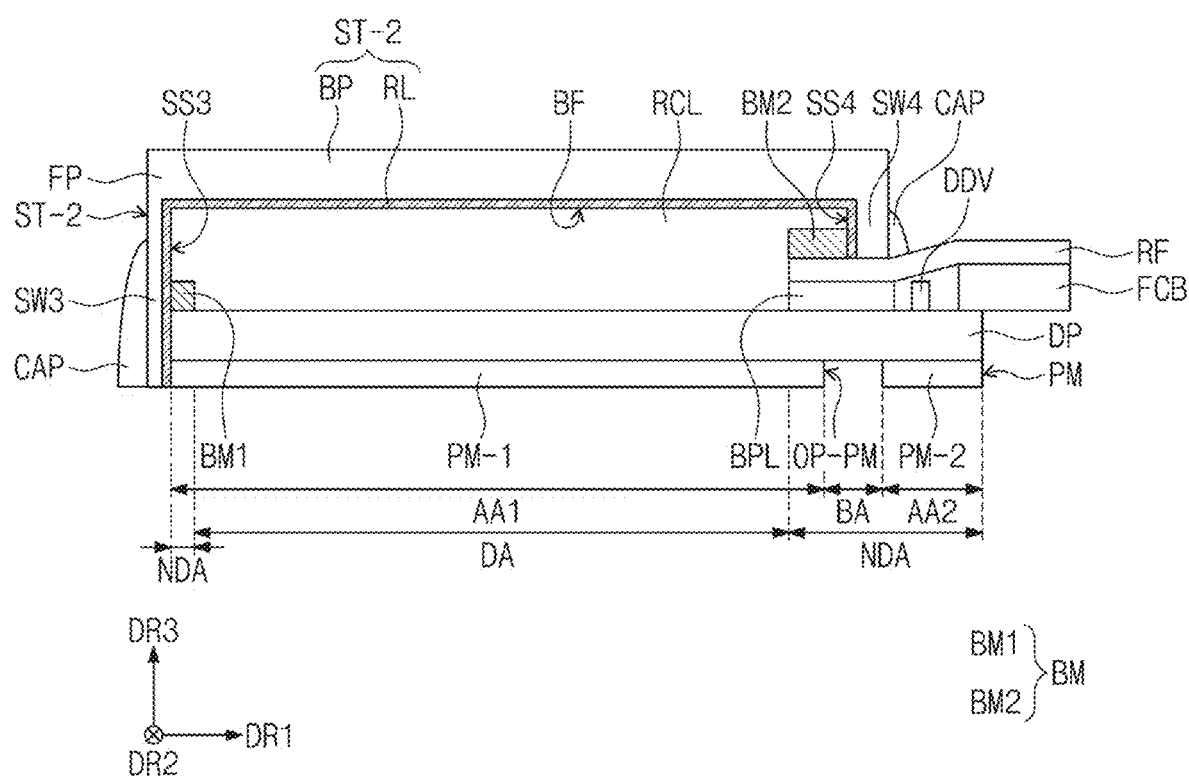

DISPLAY DEVICE AND METHOD FOR MANUFACTURING THE SAME

This application claims priority to Korean Patent Application No. 10-2022-0071016, filed on Jun. 10, 2022, and all the benefits accruing therefrom under 35 U.S.C. § 119, the content of which in its entirety is herein incorporated by reference.

BACKGROUND

The present disclosure herein relates to a display device and a method for manufacturing the same.

A display device includes a window, a housing, and a display panel. The display panel may include various types of elements activated according to electrical signals, such as a display element, a touch element, or a detection element.

The window protects the display panel and provides active regions to users. Accordingly, the users provide inputs to the display panel or receive information generated in the display panel through the window. In addition, the display panel may be stably protected from external shocks through the window.

SUMMARY

The present disclosure provides a display device having increased reliability.

The present disclosure also provides a method for manufacturing a display device in which defects such as bubbles and foreign substances are prevented and product reliability is increased.

An embodiment of the present invention provides a method for manufacturing a display device including: preparing a display panel including a first region, a bending region, and a second region, which are arranged in a first direction; disposing a release film overlapping the bending region on the display panel; applying a resin onto the first region to form a resin coating layer; pressing the resin coating layer, using a stamp coated with a release material; and curing the resin coating layer to form a preliminary resin layer.

In an embodiment, the method may further includes cutting the preliminary resin layer along a border of the display panel after the forming of the preliminary resin layer.

In an embodiment, after the cutting of the preliminary resin layer, a resin layer including a first portion and a second portion may be formed, the first portion may be disposed on the display panel and overlap the first region, and the second portion may extend from the first portion along the first direction and overlap at least the bending region.

In an embodiment, the second portion may have a smaller thickness than first portion.

In an embodiment, the resin layer may include an upper surface spaced apart from the display panel, a lower surface adjacent to the display panel, and a side surface connecting the upper surface and the lower surface. The upper surface may be parallel to a plane defined by the first direction and a second direction crossing the first direction.

In an embodiment, the side surface may be parallel to a third direction crossing the first direction and the second direction.

In an embodiment, the resin layer may include an upper surface spaced apart from the display panel, and the upper surface of the resin layer may include a curved surface.

In an embodiment, the stamp may include a certain surface in contact with the resin coating layer, and the certain surface may be coated with the release material.

In an embodiment, the certain surface of the stamp may be parallel to a plane defined by the first direction and a second direction crossing the first direction.

In an embodiment, the certain surface of the stamp may include a first surface parallel to a plane defined by the first direction and a second direction crossing the first direction, and a second surface bent from the first surface.

In an embodiment, the stamp may include a flat portion and a side portion perpendicular to the flat portion, and the stamp may include a molding space defined by the flat portion and the side portion.

In an embodiment, the method may further include forming a light blocking pattern overlapping a portion of the display panel on the display panel before the applying of the resin.

In an embodiment, in the forming of the light blocking pattern, a first light blocking portion may be formed to be disposed on the display panel and overlap the first region, and a second light blocking portion may be formed to be disposed on the display panel and overlap the bending region.

In an embodiment, a distance between an upper surface of the display panel and an upper surface of the second light blocking portion may be greater than a distance between the upper surface of the display panel and an upper surface of the first light blocking portion.

In an embodiment, in the preparing of the display panel, forming a bending protection layer on the display panel to overlap the bending region may be performed, and the release film may cover an upper surface of the bending protection layer.

In an embodiment, the pressing of the resin coating layer, and the curing of the resin coating layer to form a preliminary resin layer may be concurrently performed.

In an embodiment, the method may further include removing the release film.

In an embodiment of the present invention, a method for manufacturing a display device includes: preparing a display panel having a transmission region and a light blocking region surrounding the transmission region, and including a bending region extending from a side of the light blocking region; disposing a release film overlapping the bending region on the display panel; forming a light blocking pattern overlapping the light blocking region; providing a resin on the display panel to overlap the transmission region to form a resin coating layer; pressing the resin coating layer in a thickness direction of the display panel; curing the resin coating layer; and removing the release film.

In an embodiment, the pressing of the resin coating layer may be pressing the resin coating layer, using a stamp coated with a release material.

In an embodiment of the present invention, a display device includes: a display panel including a transmission region through which light passes and a light blocking region adjacent to the transmission region; and a window disposed on the display panel, wherein the window includes: a resin layer including an upper surface spaced apart from the display panel; a light blocking pattern disposed between the display panel and the resin layer and overlapping the light blocking region; and a residual release material disposed on the upper surface of the resin layer.

BRIEF DESCRIPTION OF THE FIGURES

The accompanying drawings are included to provide a further understanding of the present invention, and are incorporated in and constitute a part of this specification. The drawings illustrate embodiments of the present invention and, together with the description, serve to explain principles of the present invention. In the drawings:

FIGS. 9A and 9B are views showing some processes in a method for manufacturing a display device according to an embodiment of the present invention.

DETAILED DESCRIPTION

Figure 1A:
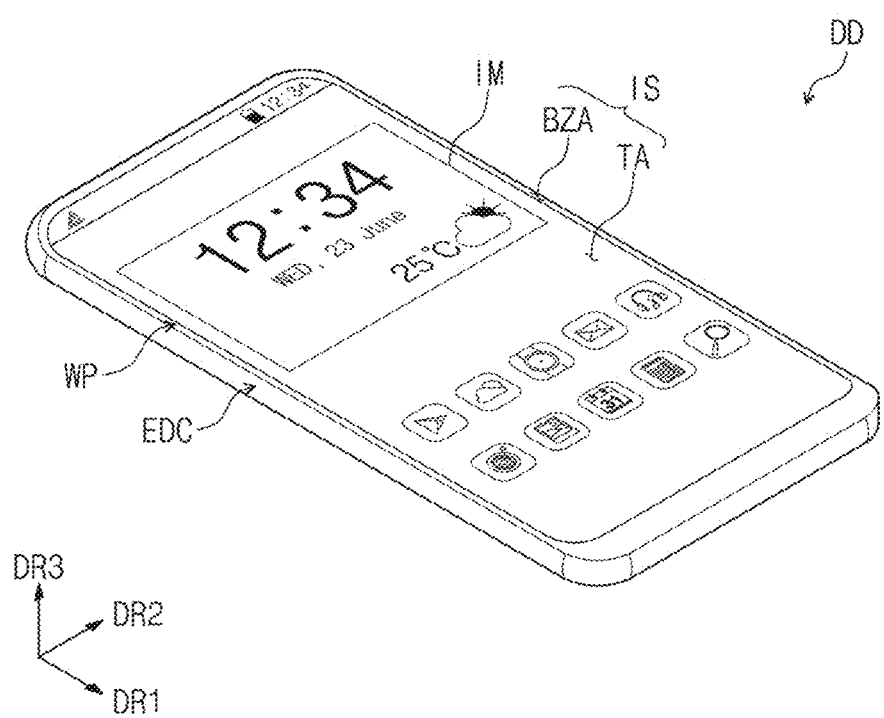
FIG. 1A is a perspective view of a display device according to an embodiment of the present invention.

Hereinafter, embodiments of the present invention will be described with reference to the drawings.

In this specification, it will also be understood that when a component (a region, a layer, a portion, or the like) is referred to as "being on", "being connected to", or "being coupled to" another component, it may be directly connected/coupled to another component, or an intervening third component may be also disposed therebetween.

Like numbers refer to like elements throughout. In addition, in the drawings, the thickness, the ratio, and the dimensions of elements are exaggerated for an effective description of technical contents. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or," includes all combinations of one or more of which associated configurations may define.

It will be understood that, although the terms "first," "second," etc. may be used herein to describe various elements, these elements should not be limited by these terms. These terms are only used to distinguish one element from another element. For example, a first element may be referred to as a second element, and similarly, a second element may be referred to as a first element without departing from the teachings of the present disclosure. The singular forms are intended to include the plural forms as well, unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

As used herein, being "disposed directly on" may mean that there is no additional layer, film, region, plate, or the like between a part and another part such as a layer, a film, a region, a plate, or the like. For example, being "disposed directly on" may mean that two layers or two members are disposed without using an additional member such as an adhesive member, therebetween.

Unless otherwise defined, all terms (including technical and scientific terms) used herein have the same meaning as commonly understood by one of ordinary skill in the art to which the present disclosure belongs. In addition, terms, such as those defined in commonly used dictionaries, should be interpreted as having a meaning that is consistent with their meaning in the context of the relevant art and should not be interpreted in an idealized or overly formal sense unless expressly so defined herein.

Hereinafter, a display device according to an embodiment and a method for manufacturing the same will be described with reference to the accompanying drawings.

Figure 1B:
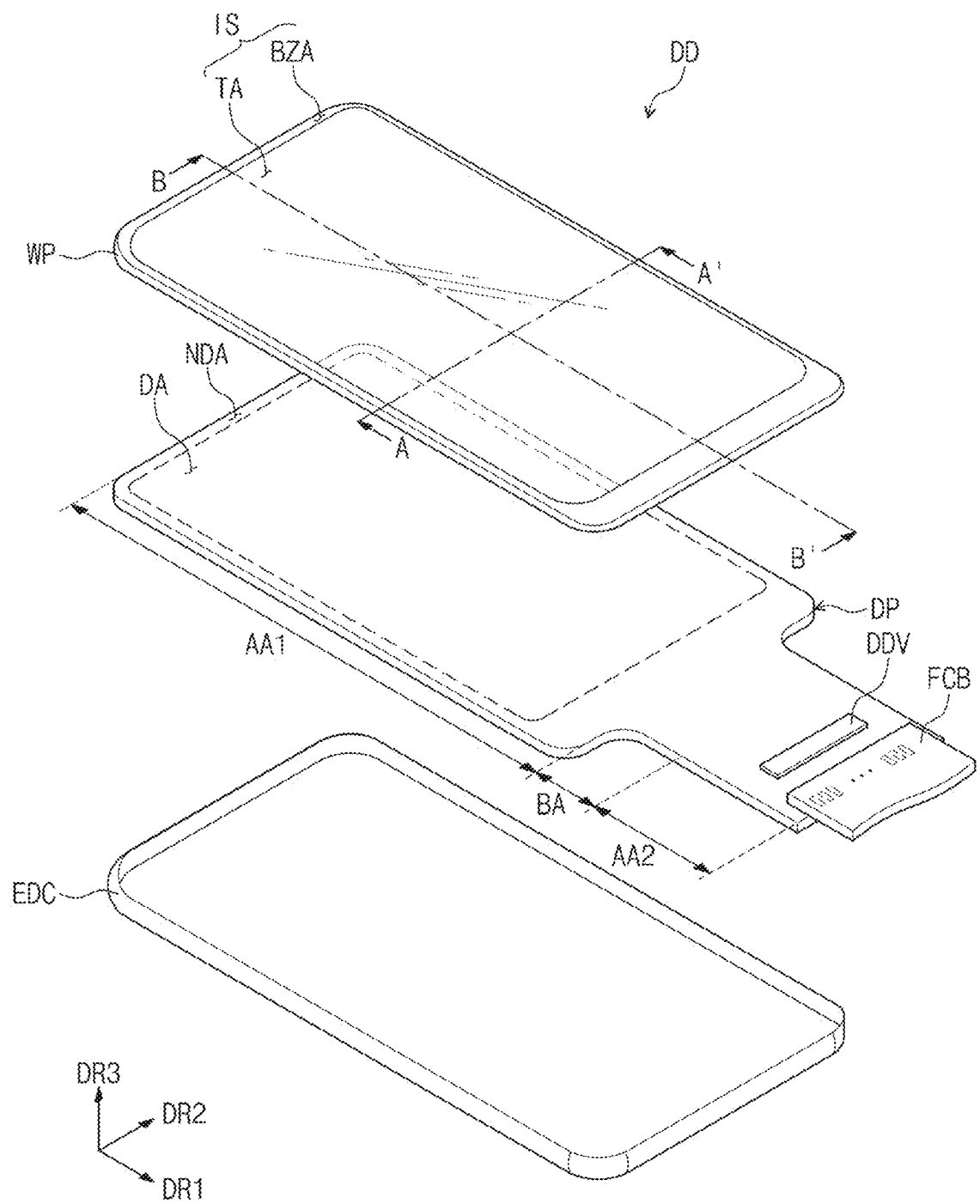
FIG. 1B is an exploded perspective view of the display device shown in FIG. TA.

FIG. 1A is a perspective view of a display device according to an embodiment of the present invention. FIG. 1B is an exploded perspective view of the display device shown in FIG. 1A.

A display device DD may be a device activated according to electrical signals. The display device DD may include various embodiments. For example, the display device DD may be a personal computer, a laptop computer, a personal digital terminal, a car navigation system, a game console, a smart phone, a tablet, a camera, and the like. In addition, these are merely presented as an example, and thus it may be adopted for other display devices without departing from the present invention. In the present embodiment, as an example, a smartphone is shown as the display device DD.

FIG. 1A and the following drawings show first to third directions DR1 to DR3, and directions indicated by the first to third directions DR1, DR2, and DR3 described herein are relative concepts, and may thus be changed to other directions.

In the present description, for convenience of description, the third direction DR3 is defined as a direction in which images are provided to users. In addition, the first direction DR1 and the second direction DR2 may be perpendicular to each other, and the third direction DR3 may be a normal direction to a plane defined by the first direction DR1 and the second direction DR2. In addition, in the present description, "in a plan view" may be defined as a state viewed in the third direction DR3. In addition, in the present description, "in a cross-sectional view" may be defined as a state viewed in the first direction DR1 or the second direction DR2. Here, the third direction DR3 may be a thickness direction of the display device DD.

The display device DD may display an image IM on a display surface IS parallel to a plane defined by the first direction DR1 and the second direction DR2, towards the third direction DR3. The display surface IS on which the image IM is displayed may correspond to a front surface of the display device DD and may correspond to a display surface FS of a window WP. Hereinafter, like reference numerals will be given for the display surface and the front surface of the display device DD, and the display surface of the window WP. The image IM may include still images as well as dynamic images. In FIG. 1A, a watch window and application icons are shown as examples of the image IM.

FIG. 1A shows a display device DD having a planar display surface IS as an example. However, the shape of the display surface IS of the display device DD is not limited thereto, and may be a curved shape or a three-dimensional shape in another embodiment.

The display device DD may be flexible. The term "flexible" indicates a property of being bendable, and may encompass various degrees of bendability from a completely foldable structure to a structure bendable to a several-nanometer degree. For example, the flexible display device DD may include a curved display device or a foldable display device. However, the embodiment of the present invention is not limited thereto, and the display device DD may be rigid in another embodiment.

The display surface IS of the display device DD may be divided into a transmission region TA and a light blocking region BZA. The transmission region TA may be a region in which the image IM is displayed. The transmission region TA may allow users to view the image IM. In the present embodiment, the transmission region TA is shown to have a rectangular shape with rounded corners, but this is presented as an example, and the transmission region TA may have various shapes.

The light blocking region BZA may be a region having a predetermined color and blocking light. The light blocking region BZA may be positioned adjacent to the transmission region TA. For example, the light blocking region BZA may be placed outside the transmission region TA to surround the transmission region TA. Accordingly, the shape of the transmission region TA may be substantially defined by the light blocking region BZA. However, this is presented as an example, and the light blocking region BZA may be positioned adjacent to only one side of the transmission region TA or may be omitted. In addition, the light blocking region BZA may be disposed on a side surface of the display device DD instead of the front surface thereof.

The display device DD according to an embodiment may detect external inputs applied from the outside. The external inputs may have various forms such as pressure, temperature, light, or the like provided from the outside. The external inputs may include inputs applied when being in contact (e.g., contact by a user's hand or a pen) with the display device DD, as well as inputs applied when being close to the display device DD such as hovering.

Referring to FIG. TA, the display device DD may include a window WP and a case EDC. The window WP may be combined with the case EDC to form an exterior of the display device DD, and may provide an inner space for housing components of the display device DD.

Referring to FIG. 1B, the display device DD may include a window WP, a display panel DP, a driving chip DDV, a printed circuit board FCB, and a case EDC.

Figure 2:
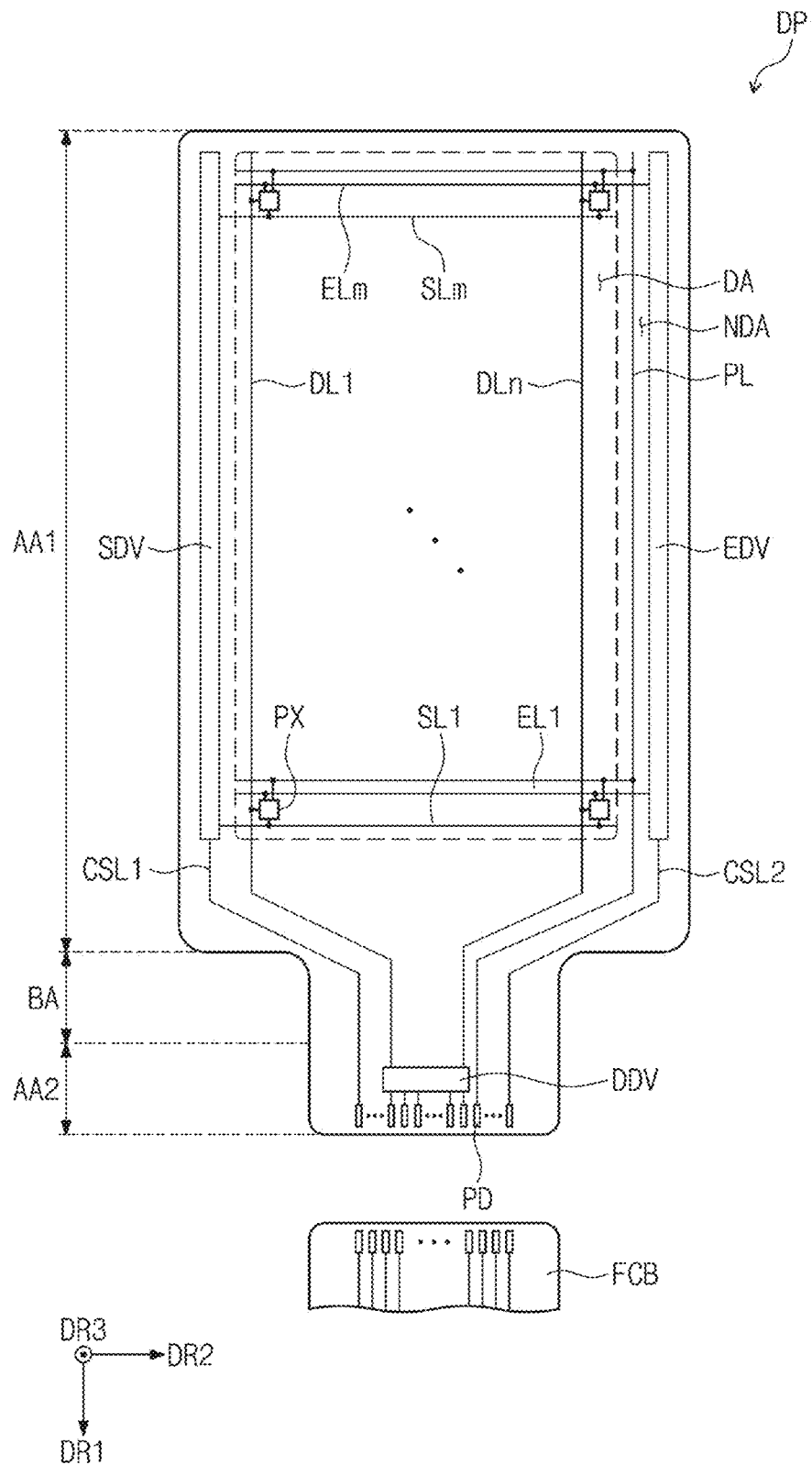
FIG. 2 is a plan view of a display panel according to an embodiment of the present invention.

Referring to FIG. 1B, the display panel DP may include a display region DA and a non-display region NDA around the display region DA. The display region DA and the non-display region NDA may be defined with respect to presence/absence of pixels PX (FIG. 2). The display region DA and the non-display region NDA may correspond to the transmission region TA and the light blocking region BZA of FIG. TA, respectively. In the present description, "a region/portion corresponds to another region/portion" indicates that "the regions/portions overlap each other", but is not limited to having the same surface area and/or having the same shape.

Figure 5A:
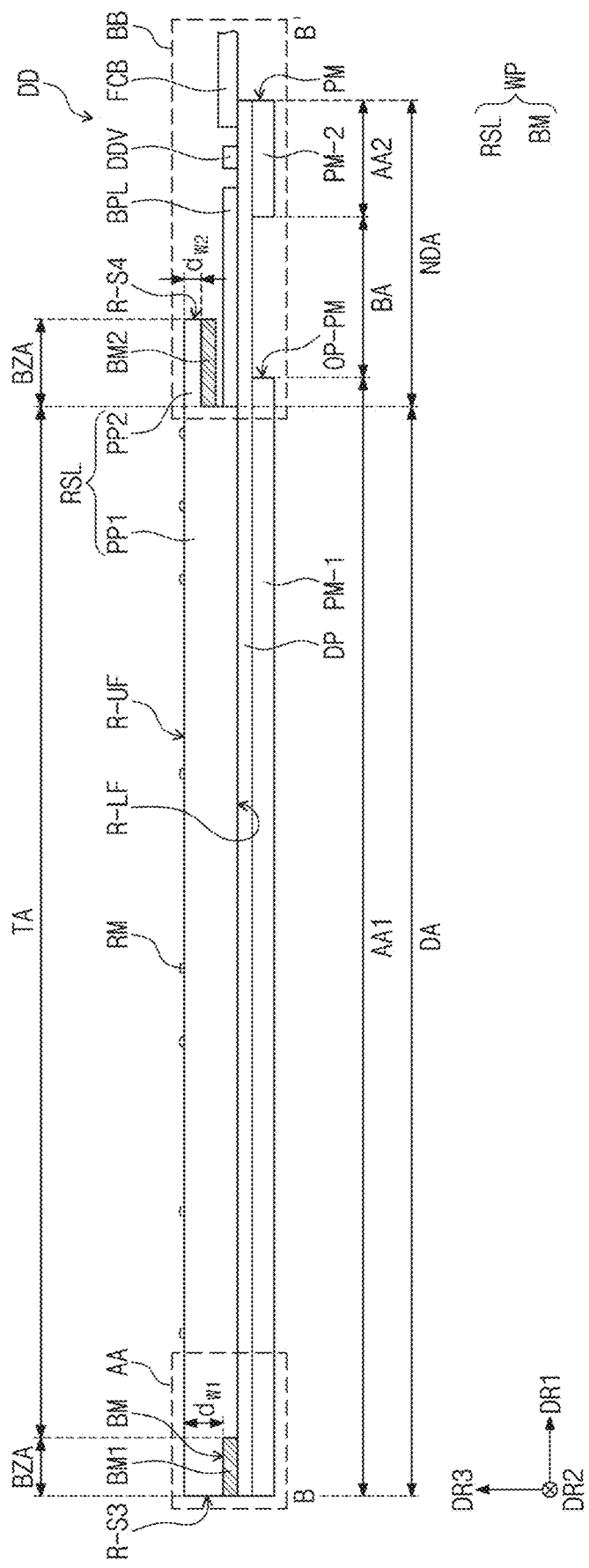
FIG. 5A is a cross-sectional view of a display device according to an embodiment of the present invention.
Figure 5B:
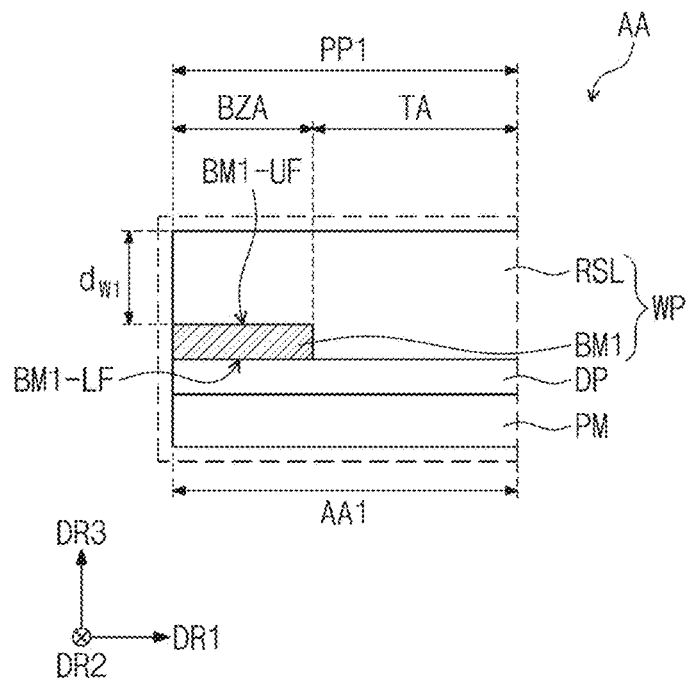
FIGS. 5B and 5C are cross-sectional views showing a portion of a display device according to an embodiment.
Figure 5C:
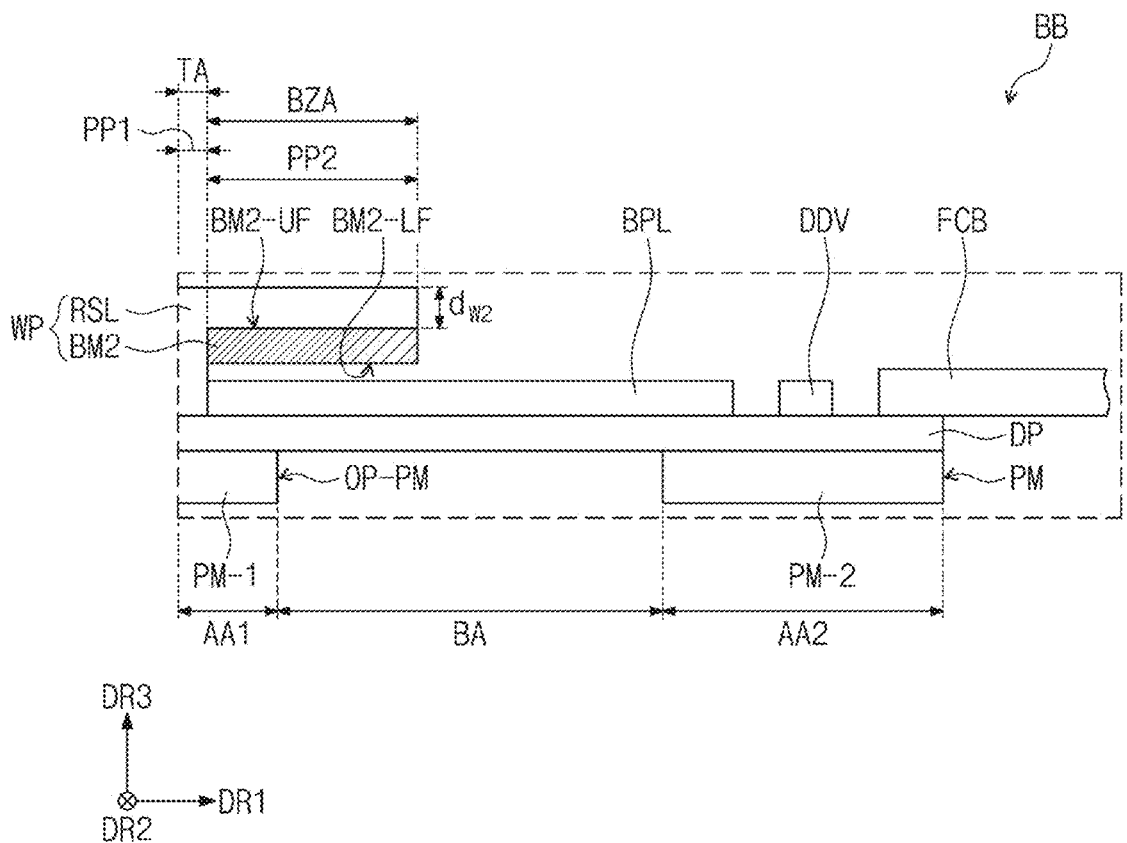
Figure 5D:
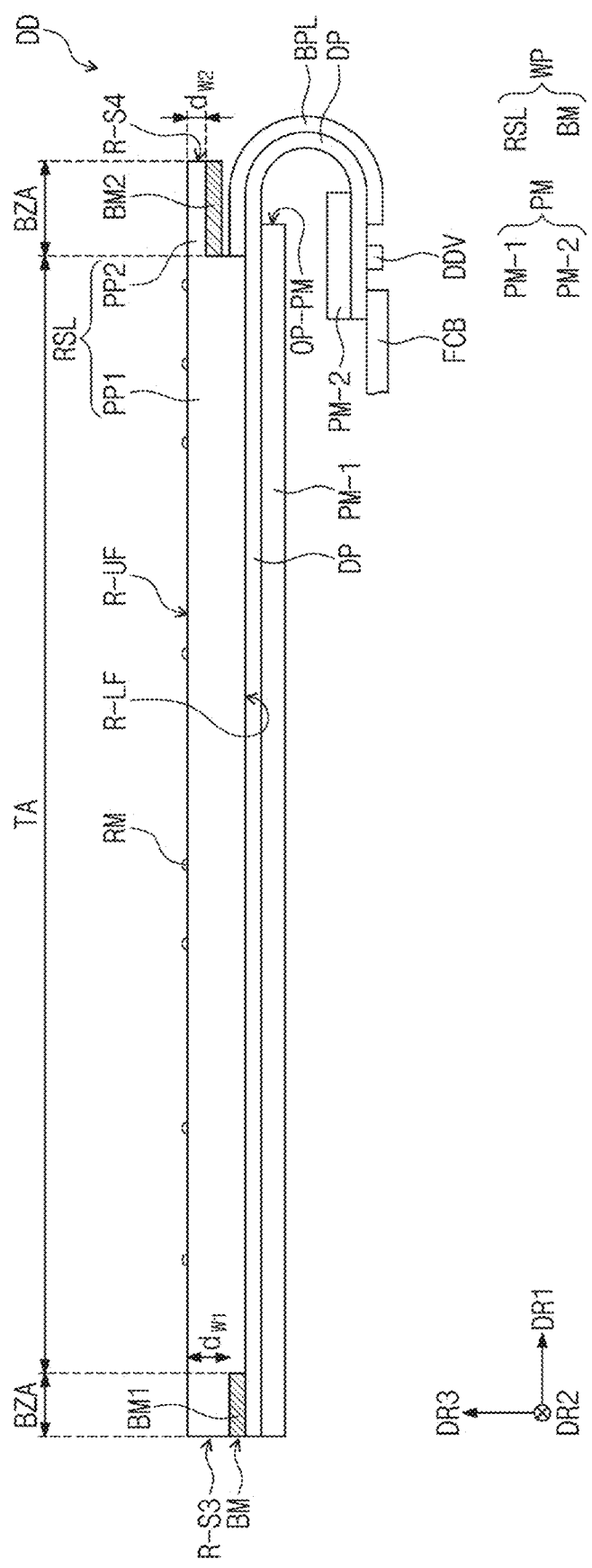
FIG. 5D is a cross-sectional view of a display device according to an embodiment of the present invention.

The display panel DP may include a first region AA1, a bending region BA, and a second region AA2, which are separated in the first direction DR1. The first region AA1, the bending region BA, and the second region AA2 may be arranged along the first direction DR1. The bending region BA may extend from the first region AA1 along the first direction DR1, and the second region AA2 may extend from the bending region BA along the first direction DR1. When a final display device DD is unfolded as shown in FIG. 1A, the first region AA1 and the second region AA2 of the display panel DP mounted on the display device DD are disposed on different planes. This is shown in FIG. 5D. The bending region BA may be disposed between the first region AA1 and the second region AA2. The bending shape of the bending region BA will be described later with reference to FIG. 5D. FIG. 1B shows an unfolded state of the display panel DP before being mounted on the display device DD. The first region AA1 may be a region corresponding to the display surface IS of FIG. 1A.

The length of the bending region BA and the length of the second region AA2 may be smaller than the length of the first region AA1 in the second direction DR2. However, the shapes of the first region AA1, the bending region BA, and the second region AA2 are not limited thereto.

The display region DA of the display panel DP may be defined in the first region AA1. The display region DA may be a region activated according to electrical signals and emitting images. The display region DA may correspond to the transmission region TA of FIG. 1A. Images displayed in the display region DA may be viewed from the outside through the transmission region TA.

The non-display region NDA may be adjacent to the display region DA. For example, the non-display region NDA may surround the display region DA. However, the embodiment of the present invention is not limited thereto, and the non-display region NDA may be defined in various shapes. The second region AA2 and the bending region BA may be a portion of the non-display region NDA. The non-display region NDA may correspond to the remaining region excluding the display region DA defined in the first region AA1, the bending region BA, and the second region AA2.

The non-display region NDA may be a region in which a driving circuit or driving wiring for driving the display region DA, various signal lines for providing electric signals, and pads may be disposed. The non-display region NDA defined in the first region AA1 may correspond to a light blocking region BZA shown in FIG. 1A. The light blocking region BZA may prevent components of the display panel DP disposed in the non-display region NDA from being viewed from the outside.

The driving chip DDV may be disposed in the second region AA2 of the display panel DP. The driving chip DDV may be manufactured in the form of an integrated circuit chip and mounted on the second region AA2.

The printed circuit board FCB may be disposed adjacent to one end of the second region AA2. The printed circuit board FCB may be disposed to be spaced apart from the driving chip DDV in the first direction DR1.

The printed circuit board FCB may include electronic elements mounted in a board. The electronic elements may be electrically connected through circuit lines. The printed circuit board FCB may be connected to pads disposed in the second region AA2, and electrically connected to the display panel DP. Although not shown separately, the printed circuit board FCB may be electrically connected to a motherboard of an electronic module constituting the display device DD through a connector.

Although not shown, the display device DD may further include an input sensing layer disposed on the display panel DP to sense external inputs. In an embodiment, the input sensing layer may be disposed on the display panel DP.

The window WP may be disposed on the display panel DP. The window WP may protect the display panel DP from external shocks. The window WP may include a transmission region TA and a light blocking region BZA. A display surface IS of the window WP including the transmission region TA and the light blocking region BZA corresponds to the display surface IS of the display device DD. Users may view images provided through the transmission region TA corresponding to the display surface IS of the display device DD.

In the present embodiment, the transmission region TA is shown to have a rectangular shape with rounded corners. However, this is presented as an example, and the transmission region TA may have various shapes and is not limited to any one embodiment.

The transmission region TA may be an optically transparent region. The light blocking region BZA may be a portion having a relatively lower light transmittance than the transmission region TA. The light blocking region BZA may have a predetermined color. The light blocking region BZA may be adjacent to the transmission region TA and may surround the transmission region TA. The light blocking region BZA may define a shape of the transmission region TA. However, the embodiment of the present invention is not limited to what is shown, and the light blocking region BZA may be disposed adjacent to only one side of the transmission region TA, and a portion thereof may be omitted in another embodiment.

The window WP may include an optically transparent insulating material. The window WP may include a resin layer RSL (see FIG. 4) and a light blocking pattern BM (see FIG. 4). Details of the resin layer RSL, (see FIG. 4) and the light blocking pattern BM of the window WP (see FIG. 4) will be described later.

The case EDC may be disposed below the display panel DP to receive the display panel DP. The case EDC absorbs shocks applied from the outside and prevents foreign substances/moisture from penetrating into the display panel DP to protect the display panel DP. In an embodiment, the case EDC may be provided in the form that a plurality of receiving members is combined.

The display device DD may further include an electronic module including various functional modules for operating the display panel DP, a power supply module for supplying power for the display device DD, a display panel DP, and/or a bracket combined with the case EDC to divide an internal space of the display device DD.

Figure 3:
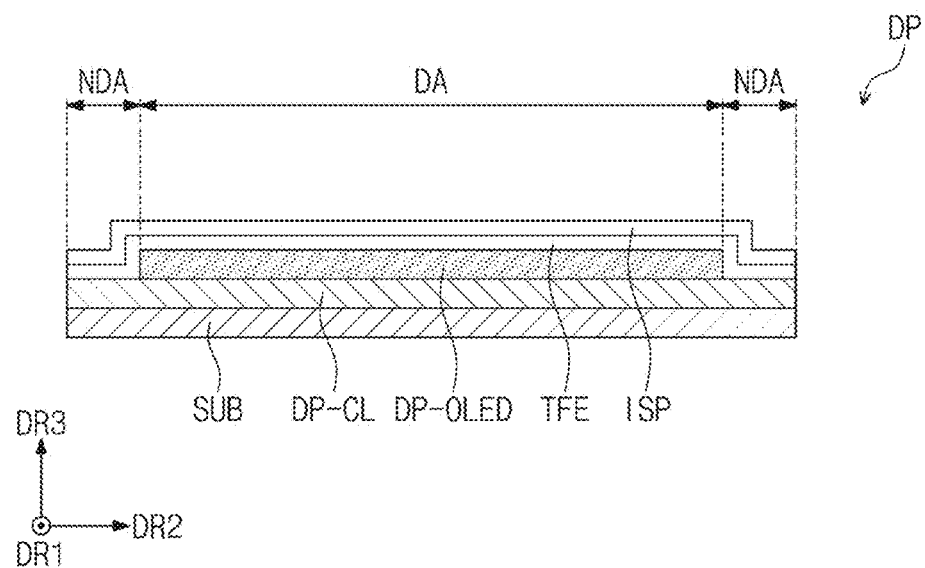
FIG. 3 is a cross-sectional view of a display panel according to an embodiment of the present invention.

FIG. 2 is a plan view of a display panel according to an embodiment of the present invention. FIG. 3 is a cross-sectional view of a display panel according to an embodiment of the present invention.

Referring to FIG. 2, the display panel DP may include a plurality of pixels PX disposed in the display region DA, and a plurality of signal lines electrically connected to pixels PX. The display panel DP may include a plurality of pads PD disposed in the non-display region NDA, a scan driver SDV, and an emission driver EDV.

The pixels PX may each include a pixel driving circuit including a light emitting element which will be described later, a plurality of transistors (e.g., a switching transistor, a driving transistor, or the like) connected to the light emitting element, and a capacitor. Each of the pixels PX may emit light in response to electrical signals applied.

The plurality of signal lines may include scan lines SL1 to SLm, data lines DL1 to DLn, light emitting lines EL1 to ELm, first and second control lines CSL1 and CSL2, and a power line PL. In this case, m and n are each a natural number. The pixels PX may each be connected to a corresponding scan line among the scan lines SL1 to SLm and a corresponding data line among the data lines DL1 to DLn. More types of signal lines may be provided in the display panel DP according to components of a pixel driving circuit of the pixels PX.

The scan driver SDV and the emission driver EDV may be disposed in the non-display region NDA. The scan driver SDV and the emission driver EDV may each be disposed adjacent to long sides of the non-display region NDA of the first region AA1.

The scan lines SL1 to SLm may extend in the second direction DR2 and be connected to the scan driver SDV. The data lines DL1 to DLn may extend in the first direction DR1, and be connected to the driving chip DDV via the bending region BA. The emission lines EL1 to ELm may extend in the second direction DR2 and be connected to the emission driver EDV.

The power line PL may extend in the first direction DR1 and be disposed between the display region DA and the emission driver EDV. However, the embodiment of the present invention is not limited thereto, and the power line PL may be disposed between the display region DA and the scan driver SDV in another embodiment. The power line PL may extend to the second region AA2 via the bending region BA. The power line PL may be connected to a corresponding pad PD among the pads PD disposed below the second region AA2 to receive a voltage. The power line PL may provide a reference voltage to the pixels PX through the connection lines.

The data lines DL1 to DLn may be connected to corresponding pads PD through the driving chip DDV. For example, the data lines DL1 to DLn may be connected to the driving chip DDV, and the driving chip DDV may be connected to the pads PD corresponding to the data lines DL1 to DLn, respectively.

The pads PD may be arranged in one direction on the non-display region NDA of the second region AA2. The pads PD may be disposed adjacent to an end of the second region AA2, which extends in the first direction DR1 and may be arranged in the second direction DR2. The pads PD may be portions connected to the printed circuit board FCB. The pads PD may each be connected to a corresponding signal line among a plurality of signal lines.

The printed circuit board FCB may be connected to the pads PD to control operations of the scan driver SDV, the emission driver EDV, and the driving chip DDV. The printed circuit board FCB may be a board on which a timing controller provided in the form of an integrated circuit chip is mounted. The timing controller may generate a scan control signal, a data control signal, and an emission control signal in response to control signals received from the outside.

The scan driver SDV may generate a plurality of scan signals in response to scan control signals. The scan signals may be applied to the pixels PX through the scan lines SL1 to SLm. A data driver of the driving chip DDV may generate a plurality of data voltages corresponding image signals in response to data control signals. The data voltages may be applied to the pixels PX through the data lines DL1 to DLn. The emission driver EDV may generate a plurality of emission signals in response to emission control signals. The emission signals may be applied to the pixels PX through the emission lines EL1 to ELm.

The pixels PX may be provided with the data voltages in response to the scan signals. The pixels PX may display images by emitting light of luminance corresponding to the data voltages in response to the emission signals. Images may be output through the display region DA defined in the first region AA1 by the pixels PX.

A plurality of signal lines extending from the first region AA1 to the second region AA2 may be disposed on the bending region BA of the display panel DP. As the bending protection layer BPL (FIG. 5A) covers the bending region BA, the plurality of signal lines disposed on the bending region BA may be prevented from being damaged by external shocks.

Referring to FIG. 3, the display panel DP may include a base layer SUB, a circuit element layer DP-CL disposed on the base layer SUB, a display element layer DP-OLED, and an upper insulating layer TFE. The display panel DP may include a display region DA and a non-display region NDA. The display region DA of the display panel DP may correspond to the transmission region TA shown in FIG. 1A, and the non-display region NDA may correspond to the light blocking region BZA shown in FIG. TA.

The base layer SUB may include at least one plastic film. The base layer SUB may include a plastic substrate, a glass substrate, a metal substrate, an organic/inorganic composite material substrate or the like as a flexible substrate.

The circuit element layer DP-CL may include at least one intermediate insulating layer and a circuit element. The intermediate insulating layer may include at least one intermediate inorganic film and/or at least one intermediate organic film. The circuit element may include signal lines, a pixel driving circuit, or the like.

The display element layer DP-OLED includes at least one display element. Non-limiting examples of the display element included in the display element layer DP-OLED may include various light emitting elements such as LCD, LED, micro-LED, nano-LED, quantum dot, or quantum rod. Hereinafter, a case in which the display device is an organic light emitting element will be described as an example. The light emitting element layer DP-OLED may further include an organic film such as a pixel definition film.

The upper insulating layer TFE may be disposed on the display element layer DP-OLED. The upper insulating layer TFE may seal the display element layer DP-OLED. The upper insulating layer TFE may be a thin film encapsulation layer. The upper insulating layer TFE may serve to protect the light emitting element layer DP-OLED from moisture, oxygen, and foreign substances such as dust particles. The upper insulating layer TFE may include a plurality of thin films. The plurality of thin films may include a thin film encapsulation layer. The thin film encapsulation layer may have a stack structure of an inorganic film/organic film/inorganic film. However, the embodiment of the present invention is not limited thereto, and an encapsulation substrate may be provided instead of the upper insulating layer TFE in another embodiment. The encapsulation substrate may face the base layer SUB, and the circuit element layer DP-CL and the display element layer DP-OLED may be disposed between the encapsulation substrate and the base layer SUB. In this case, the display device DD may include a sealant bonding the base layer SUB and the encapsulation substrate.

An input sensing layer ISP may be disposed on the upper insulating layer TFE. The input sensing layer ISP may sense external inputs. The external inputs applied from the outside may be provided in various forms. For example, the external inputs may include various types of external inputs such as a part of a user's body, a stylus pen, light, heat, or pressure. In addition, inputs through contact by a part of a body such as a user's hand and close or adjacent air touch (e.g., hovering) may be a form of inputs. The input sensing layer ISP may be directly disposed on the upper insulating layer TFE. In the present description, "a component B is disposed directly on a component A" indicates that an adhesive layer is not disposed between the component A and the component B. In the present embodiment, the input sensing layer ISP may be manufactured through a roll-to-roll process with the upper insulating layer TFE. However, the embodiment of the present invention is not limited thereto, and the input sensing layer ISP may be provided as an individual panel and bonded to the display panel DP through an adhesive layer in another embodiment. For another example, the input sensing layer ISP may be omitted.

In addition, although not shown, an auxiliary insulating layer may be further disposed between the input sensing layer ISP and the upper insulating layer TFE. For example, the auxiliary insulating layer may be an inorganic layer. In this case, some of conductive patterns included in the input sensing layer ISP may be directly formed on the auxiliary insulating layer.

Figure 4:
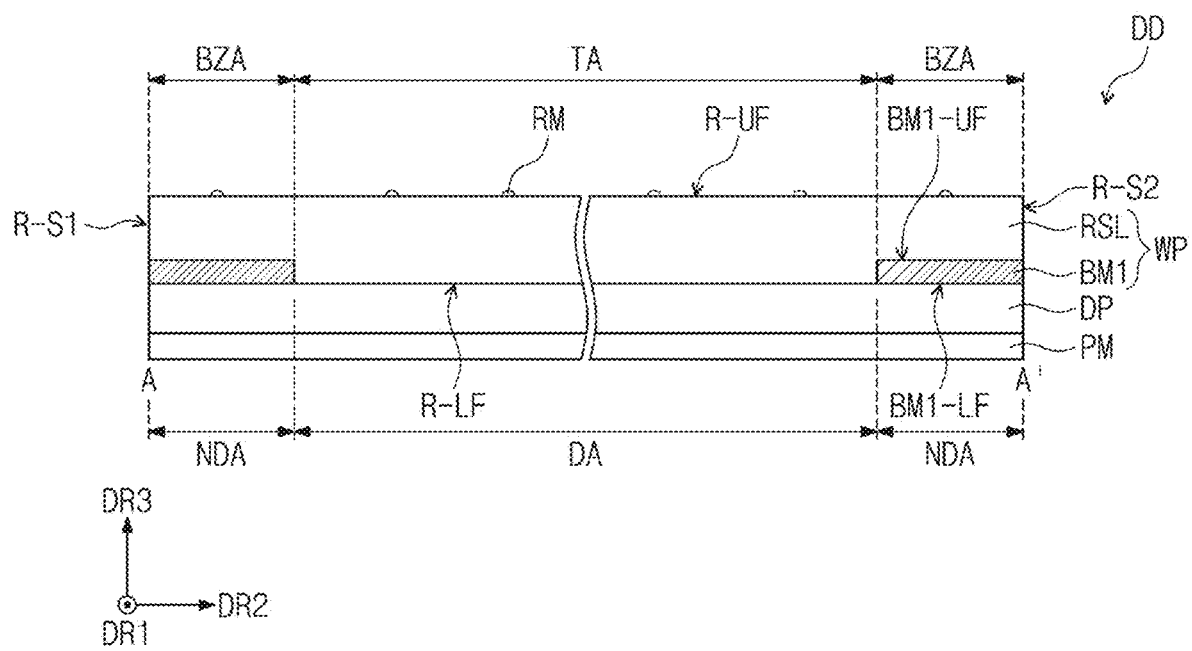
FIG. 4 is a cross-sectional view of a display device according to an embodiment of the present invention.

FIG. 4 is a cross-sectional view of a display device according to an embodiment of the present invention. FIG. 4 is a cross-sectional view of a portion corresponding to line A-A' of FIG. 1B. FIG. 5A is a cross-sectional view of a display device according to an embodiment of the present invention. FIG. 5A is a cross-sectional view of a portion corresponding to line B-B' of FIG. 1B. FIGS. 5B and 5C are cross-sectional views showing a portion of a display device according to an embodiment. FIG. 5B is a cross-sectional view of a portion corresponding to region "AA" of FIG. 5A. FIG. 5C is a cross-sectional view of a portion corresponding to region "BB" of FIG. 5A. FIG. 5D is a cross-sectional view of a display device according to an embodiment of the present invention. FIG. 5D is a cross-sectional view showing a state in which a portion of the display panel shown in FIG. 5A is bent.

Referring to FIGS. 4, and 5A to 5D, the display panel DP may include a first region AA1, a bending region BA, and a second region AA2, which are arranged along the first direction DR1. The bending region BA may extend from the first region AA1 in the first direction DR1. The second region AA2 may extend from the bending region BA in the first direction DR1. The bending region BA may be disposed between the first region AA1 and the second region AA2.

The bending region BA may be a region bent with a predetermined curvature. Over a process of manufacturing the display device DD, the bending region BA may be bent such that the second region AA2 overlaps the first region AA1 in a plan view. That is, as the bending region BA is bent, the second region AA2 may be disposed on a rear surface of the display panel DP corresponding to the first region AA1.

The bending region BA may be a region having a predetermined curvature in a bent state. The second region AA2 may be a region facing the first region AA1 in a bent state. The bending region BA may be adjacent to the first region AA1 and substantially curved. The second region AA2 may be adjacent to the bending region BA and flat without being bent. As the bending region BA of the display panel DP is bent, the second region AA2 may face the first region AA1. The printed circuit board FCB may be connected to the second region AA2 of the display panel DP.

The bending protection layer BPL may be disposed on at least the bending region BA. The bending protection layer BPL may overlap the bending region BA, the first region AA1, and the second region AA2. The bending protection layer BPL may be disposed on a portion of the first region AA1 and a portion of the second region AA2. The bending protection layer BPL may be disposed to be spaced apart from the driving chip DDV disposed in the second region AA2. However, the embodiment of the present invention is not limited thereto, and the bending protection layer BPL may be disposed on the second region AA2 to cover the driving chip DDV in another embodiment. In addition, the bending protection layer BPL may cover a portion of the printed circuit board FCB disposed in the second region AA2. However, the embodiment of the present invention is not limited thereto.

A panel protection member PM may be disposed below the display panel DP. The panel protection member PM may be disposed to correspond to the first region AA1 and the second region AA2. The panel protection member PM may not be disposed in the bending region BA. An opening OP-PM overlapping the bending region BA in a plan view may be defined in the panel protection member PM. The opening OP-PM may be formed by removing a portion of the panel protection member PM. The panel protection member PM may include an upper surface adjacent to the display panel DP and a lower surface facing the upper surface. The opening OP-PM may be an opening defined from the upper surface of the panel protection member PM to the lower surface of the panel protection member PM as shown in FIG. 5A. Accordingly, the panel protection member PM may include a first protection member PM-1 and a second protection member PM-2, which are separated with the opening OP-PM therebetween. The first protection member PM-1 may be disposed below the first region AA1 of the display panel DP. The second protection member PM-2 may be disposed below the second region AA2 of the display panel DP. That is, the panel protection member PM may not be disposed in the bending region BA of the display panel DP.

When the panel protection member PM is disposed below the bending region BA, the bending region BA of the display panel DP may become thicker, and accordingly, bending may not be operable. However, since the opening OP-PM is defined in the panel protection member PM and the panel protection member PM is not disposed below the bending region BA, the bending region BA of the display panel DP may thus be easily bent. The removing of the panel protection member PM from the bending region BA may reduce stress generated in the bending region BA upon bending.

The panel protection member PM may be disposed below the display panel DP to protect the display panel DP. The panel protection member PM may include a flexible plastic material. For example, the panel protection member PM may include at least one of polyethylene terephthalate or polyimide. However, the material of the panel protection member PM is not limited thereto.

The window WP may be disposed on the display panel DP. The window WP may be a component in which images are actually viewed from the outside. In the present description, the window WP may define an upper surface of the display device DD and may be a cover window that covers the display panel DP. The window WP may be directly disposed on the display panel DP. That is, an adhesive may not be disposed between the window WP and the display panel DP. The window WP may be formed by directly applying a resin onto the display panel DP in a method for manufacturing a display device, which will be described later. Accordingly, a separate lamination process for bonding the window WP and the display panel DP may not be performed, and an adhesive bonding the window WP and the display panel DP may not be used.

The window WP may include a transmission region TA and a light blocking region BZA, which correspond to the transmission region TA and the light blocking region BZA of the display device DD shown in FIG. 1A. The light blocking region BZA may be defined as a region in which a light blocking pattern BM is disposed. The transmission region TA is a region that transmits light, may be defined in a central portion of the window WP in a plan view, and may occupy most of a planar area of the window WP. The light blocking region BZA may be disposed on at least one side of the transmission region TA. The light blocking region BZA may be defined in an edge region of the window WP in a plan view. The light blocking region BZA may be defined along at least a side surface of the window WP.

The window WP may include a light blocking pattern BM, a resin layer RSL, and a residual release material RM.

The light blocking pattern BM may be disposed on the display panel DP. The light blocking pattern BM may be disposed between the resin layer RSL and the display panel DP. The light blocking pattern BM may be provided on a lower surface R-LF of the resin layer RSL adjacent to the display panel DP. The light blocking pattern BM may be disposed on an edge region of the display panel DP.

The light blocking pattern BM may overlap the light blocking region BZA of the window WP in a plan view. The light blocking pattern BM may entirely overlap the light blocking region BZA and may not overlap the transmission region TA in a plan view. A region in which the light blocking pattern BM is disposed may be defined as the light blocking region BZA of the window WP. The light blocking pattern BM may be an ink printing layer. Further, the light blocking pattern BM may be a layer formed by including a pigment or a dye.

The light blocking pattern BM may include a shielding ink for blocking light. For example, a shielding ink layer may include a base material and a shielding ink. The shielding ink may be carbon black particles. However, the embodiment of the present invention is not limited thereto, and the shielding ink may include one or more known pigments, dyes, or mixtures thereof in addition to carbon black particles. The light blocking pattern BM may prevent components inside the display device DD overlapping the non-display region NDA from being viewed to the outside in another embodiment.

The light blocking pattern BM may include a first light blocking portion BM1 and a second light blocking portion BM2. The first light blocking portion BM1 may overlap the first region AA1 of the display panel DP in a plan view. The second light blocking portion BM2 may overlap the bending region BA. A portion of the second light blocking portion BM2 may overlap the first region AA1. The second light blocking portion BM2 may overlap the bending protection layer BPL. The second light blocking portion BM2 may be spaced apart from the bending protection layer BPL in the third direction DR3. The second light blocking portion BM2 may be formed on the release film RF (FIG. 7D) disposed on the bending protection layer BPL in a method for manufacturing a display device which will be described later. Accordingly, in a final display device DD from which the release film RF (FIG. 7D) is removed, the second light blocking portion BM2 may be spaced apart from the bending protection layer BPL.

Referring to FIGS. 5B and 5C, the first light blocking portion BM1 and the second light blocking portion BM2 may be formed to have a constant thickness in the third direction DR3. The first light blocking portion BM1 and the second light blocking portion BM2 may have substantially the same thickness with respect to the third direction DR3. The first light blocking portion BM1 and the second light blocking portion BM2 may be disposed on different planes. The first blocking portion BM1 may be disposed closer to the display panel DP than the second blocking portion BM2. The distance from the upper surface of the display panel DP to an upper surface BM2-UF of the second light blocking portion BM2 may be greater than the distance from the upper surface of the display panel DP to an upper surface BM1-UF of the first light blocking portion BM1.

The resin layer RSL may be disposed on the display panel DP. The resin layer RSL may be positioned on an uppermost portion of the window WP, and may be a component defining an upper surface of the window WP. That is, the upper surface of the resin layer RSL may correspond to the upper surface of the window WP. However, the embodiment of the present invention is not limited thereto, and the window WP may further include a functional coating layer disposed on the upper surface of the resin layer RSL, and the functional coating layer disposed on the uppermost portion may define the upper surface of the window WP in another embodiment. The functional coating layer may include at least one of an anti-fingerprint layer, an anti-reflection layer, or a hard coating layer.

At least a portion of the resin layer RSL may overlap the transmission region TA in a plan view. The resin layer RSL constitutes a thickness of the window WP in the transmission region TA, and is disposed on an upper portion of the light blocking pattern BM in the light blocking region BZA, and the window WP may thus have a constant thickness. A side surface of the resin layer RSL and a side surface of the light blocking pattern BM may be in the form of being aligned side by side.

The resin layer RSL may have a light transmittance of about 90% or more. The resin layer RSL may include a material having a light transmittance of about 90% or more. In an embodiment, the resin layer RSL may include at least one selected from the group consisting of polycarbonate, polymethylmethacrylate, polyimide, polyethylene terephthalate, polyacrylate, polyethylenenaphthalate, polyvinylidene chloride, polyvinylidene difluoride, polystyrene, ethylene-vinylalcohol copolymer, and triacetyl cellulose. However, the material of the resin layer RSL is not limited thereto.

The resin layer RSL may include a lower surface R-LF adjacent to the display panel DP and an upper surface R-UF facing the lower surface R-LF. The upper surface R-UF of the resin layer RSL may be spaced apart from the display panel DP. The upper surface R-UF of the resin layer RSL may be parallel to a plane defined by the first direction DR1 and the second direction DR2.

The resin layer RSL may include a first portion PP1 overlapping the first region AA1, and a second portion PP2 extending from the first portion PP1 in the first direction DR1. A portion of the first portion PP1 may overlap the first light blocking portion BM1 on the display panel DP in a plan view. The first light blocking portion BM1 may be defined on a lower surface of the first portion PPT. The first portion PP1 may cover the upper surface BM1-UF of the first light blocking portion BM1 and may be disposed on the display panel DP. The first portion PP1 may entirely cover the upper surface BM1-UF of the first light blocking portion BM1. The second portion PP2 may overlap the second light blocking portion BM2 on the display panel DP. The second light blocking portion BM2 may be defined on a lower surface of the second portion PP2. The second portion PP2 may cover the upper surface BM2-UF of the second light blocking portion BM2 and may be disposed on the display panel DP. The second portion PP2 may entirely cover the upper surface BM2-UF of the second light blocking portion BM2.

Referring to FIG. 4, in the first portion PP1, the lower surface BM1-LF of the first light blocking portion BM1 may provide a surface continuous with the lower surface R-LF of the resin layer RSL. In the first portion PP1, the lower surface R-LF of the resin layer RSL may constitute one plane, and the first light blocking portion BM1 may be in the form of being buried in the thickness direction from the lower surface R-LF of the resin layer RSL.

Referring back to FIG. 5A, the resin layer RSL may be defined by the first portion PP1 and the second portion PP2 having a single-body shape. The second portion PP2 may overlap the first region AA1 and the bending region BA in a plan view. However, the embodiment of the present invention is not limited thereto, and the second portion PP2 may overlap only the bending region BA and may not overlap the first region AAT in another embodiment.

Thicknesses of the first portion PP1 and the second portion PP2 may be different with respect to the third direction DR3. The first portion PP1 may have a first thickness $d_{W1}$ in the third direction DR3. The second portion PP2 may have a second thickness $d_{W2}$ in the third direction DR3. The first thickness $d_{W1}$ of the first portion PP1 may indicate a value obtained when a thickness from the lower surface BM1-LF of the first light blocking portion BM1 to the upper surface BM1-UF of the first light blocking portion BM1 is subtracted from a thickness from the lower surface BM1-LF of the first light blocking portion BM1 to the upper surface R-UF of the resin layer RSL, with respect to the third direction DR3. In addition, the second thickness $d_{W2}$ of the second portion PP2 may indicate a value obtained when a thickness from the lower surface BM2-LF of the second light blocking portion BM2 to the upper surface BM2-UF of the second light blocking portion BM2 is subtracted from a thickness from the lower surface BM2-LF of the second light blocking portion BM2 to the upper surface R-UF of the resin layer RSL, with respect to the third direction DR3. In an embodiment, the second thickness $d_{W2}$ of the second portion PP2 may be smaller than the first thickness $d_{W1}$ of the first portion PP1.

Referring to FIGS. 4 and 5A, the resin layer RSL may include a plurality of side surfaces R-S1, R-S2, R-S3, and R-S4. The resin layer RSL may include a first side surface R-S1 and a second side surface R-S2, which are spaced apart from each other along the second direction DR2, and may include a third side surface R-S3 and a fourth side surface R-S4, which are spaced apart from each other along the first direction DR1. The third side surface R-S3 may be adjacent to the first portion PP1 and spaced apart from the second portion PP2. The fourth side surface R-S4 may be adjacent to the second portion PP2 and spaced apart from the first portion PP1. In an embodiment, the first to third side surfaces R-S1, R-S2, and R-S3 of the resin layer RSL may be aligned with a corresponding side surface among the respective side surfaces of the display panel DP. In the present description, "a side surface of component A is aligned with a side surface of component B" may indicate that an edge of the component A and an edge of the component B are aligned with each other to define one side surface that is parallel on a cross-section.

The window WP may include a residual release material RM disposed on the resin layer RSL. The residual release material RM may be disposed on the upper surface of the resin layer RSL. The residual release material RM may be a residual material remaining after the stamp ST (FIG. 7J) is separated from the preliminary resin layer P-RSL (FIG. 7L) in a method for manufacturing a display device which will be described later. That is, upon the removing of the stamp ST shown in FIG. 7J, a portion of the residual release material RM may remain as a residue without being completely removed. This will be described later with reference to FIGS. 7A to 7N.

Although not shown, the display device DD may further include an anti-reflection layer disposed between the display panel DP and the window WP. The anti-reflection layer may prevent reflection of light incident from the outside of the display device DD from being viewed by user's eyes. The anti-reflection layer may include a polarization layer that polarizes at least a portion of light incident from the outside of the display device DD. Alternatively, the anti-reflection layer may include a color filter layer.

The anti-reflection layer may reduce reflectance of external light incident from an upper side of the window WP. The anti-reflection layer may include a retarder and a polarizer. The retarder may be a film type or a liquid crystal coating type, and may include a $\lambda/2$ retarder and/or a $\lambda/4$ retarder. The polarizer may also be a film type or a liquid crystal coating type. The film type may include a stretchable synthetic resin film, and the liquid crystal coating type may include liquid crystals arranged on a base layer in a predetermined arrangement. The retarder and the polarizer may further include a protection film.

The anti-reflection layer may include color filters disposed on a base layer. The color filters have a predetermined arrangement. Considering light emission colors of pixels included in the display panel DP, the arrangement of the color filters may be determined. The anti-reflection layer may further include a black matrix adjacent to the color filters.

The anti-reflection layer according to an embodiment of the present invention may include a destructive interference structure disposed on a base layer. For example, the destructive interference structure may include a first reflection layer and a second reflection layer disposed on different layers. A first reflection light and a second reflection light, which are reflected from the first reflection layer and the second reflection layer respectively, may destructively interfere with each other, thereby reducing reflectance of the external light.

Referring to FIG. 5D, the bending region BA may be bent such that the second region AA2 is disposed below the first region AA1. Accordingly, the driving chip DDV may be disposed below the first region AA1. That is, the first region AA1 and the second region AA2 are disposed on different planes (or reference planes). The bending region BA may be bent to be horizontally convex on a cross-section. The bending region BA may have a predetermined curvature and a radius of curvature. The radius of curvature may be about 0.1 mm to about 0.5 mm. However, the embodiment of the present invention is not limited thereto.

The bending protection layer BPL may be bent along with the bending region BA. The bending protection layer BPL may protect the bending region BA from external shocks and control a neutral plane of the bending region BA. The bending protection layer BPL may be bonded to the bending region BA to make the neutral plane close to signal lines disposed in the bending region BA.

When the bending region BA is bent, the second protection member PM-2 may be disposed below the first region AA1 and the first protection member PM-1 along with the second region AA2. The panel protection member PM is not disposed in the bending region BA, and the bending region BA may thus be more easily bent.

Figure 6A:
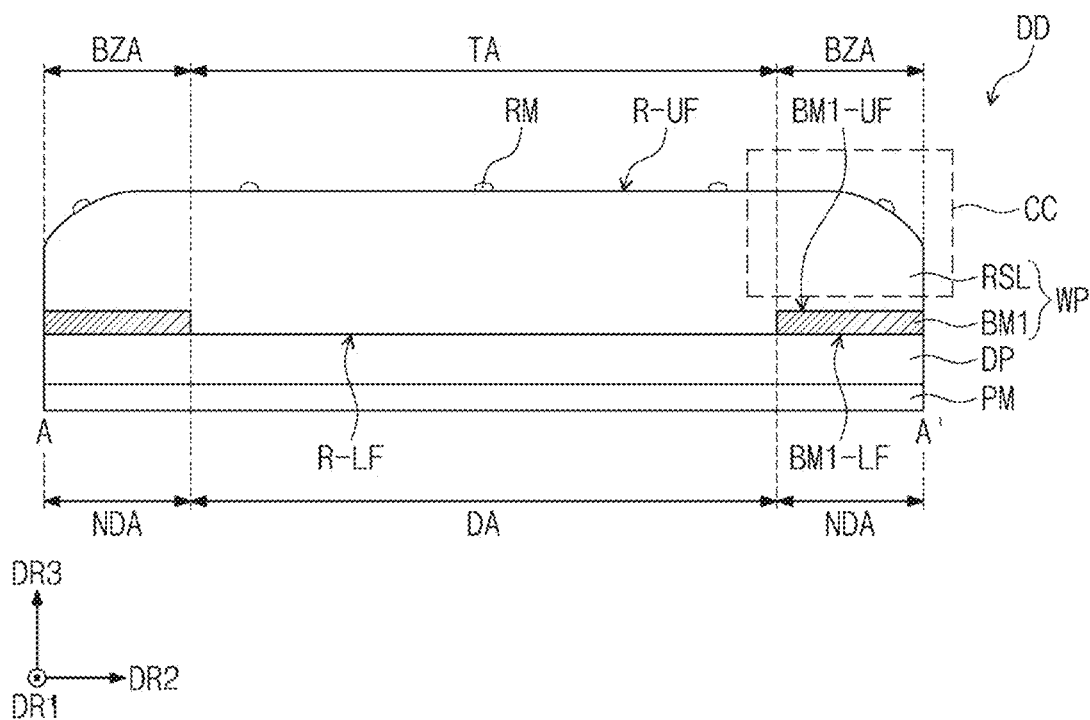
FIG. 6A is a cross-sectional view of a display device according to an embodiment of the present invention.
Figure 6B:
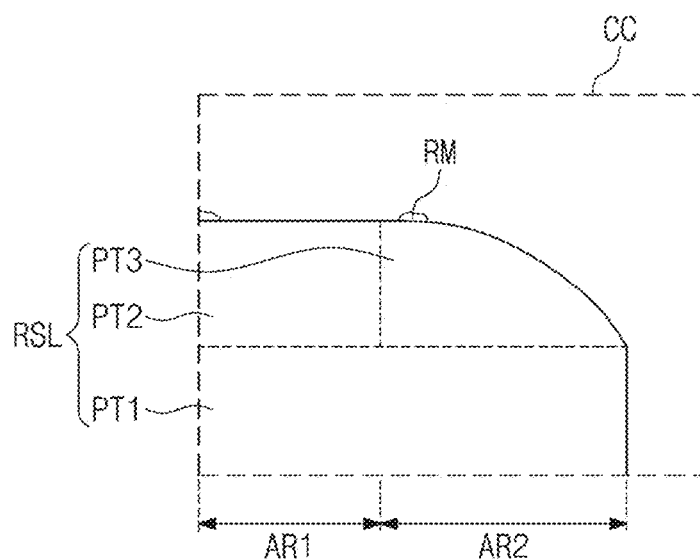
FIG. 6B is a cross-sectional view showing a portion of a display device according to an embodiment.

FIG. 6A is a cross-sectional view of a display device according to an embodiment of the present invention. FIG. 6A is a cross-sectional view of a portion corresponding to line A-A' of FIG. 1B. FIG. 6B is a cross-sectional view showing a portion of a display device according to an embodiment. FIG. 6B is a cross-sectional view of a portion corresponding to region "CC" of FIG. 6A. The display device DD shown in FIGS. 6A and 6B may have a different shape of the display surface IS (FIG. 1B) compared to the display device DD shown in FIGS. 4 and 5A to 5D. Hereinafter, in describing a method for manufacturing a display device according to an embodiment with reference to FIGS. 6A and 6B, the same reference numerals are given to components that are the same as the components described above, and detailed descriptions thereof will be omitted.

Referring to FIG. 6A, the display device DD may include a display panel DP and a window WP disposed on the display panel DP. The display device DD may further include a panel protection member PM disposed below the display panel DP.

The window WP may include a light blocking pattern BM (FIG. 5A), a resin layer RSL, and a residual release material RM. A portion of an upper surface R-UF of the resin layer RSL may have a curved shape. The upper surface R-UF of the resin layer RSL overlapping the transmission region TA may be parallel to a plane defined by the first direction DR1 and the second direction DR2 in a plan view. The upper surface R-UF of the resin layer RSL overlapping the light blocking region BZA may include a curved surface having a predetermined curvature.

Referring to FIG. 6B, the resin layer RSL may include a first resin portion PT1, a second resin portion PT2, and a third resin portion PT3. A thickness of each of the first resin portion PT1, the second resin portion PT2, and the third resin portion PT3 may be defined as a length measured in a direction parallel to the third direction DR3.

The first resin portion PT1 is a portion corresponding to a lower portion of the resin layer RSL, and the second resin portion PT2 and the third resin portion PT3 are portions corresponding to an upper portion of the resin layer RSL. The first resin portion PT1 may include a first region AR1 overlapping the transmission region TA of the display device DD, and a second region AR2 overlapping the light blocking region BZA of the display device DD in a plan view.

The second resin portion PT2 may extend in the third direction DR3 from the first region AR1 of the first resin portion PT1. The second resin portion PT2 may be a portion overlapping the display region DA. A thickness of the second resin portion PT2 may have a constant value.

The third resin portion PT3 may extend in the third direction DR3 from the second region AR2 of the first resin portion PT1, and may extend in the first direction DR1 or the second direction DR2 from the second resin portion PT2. An outer surface of the third resin portion PT3 may include a curved surface having a curvature. A thickness of the third resin portion PT3 may gradually decrease in the first direction DR1 or the second direction DR2. The third resin portion PT3 may overlap the non-display region NDA in a plan view. The resin layer RSL may have a shape in which an edge portion is rounded with a curved surface by the third resin portion PT3 overlapping the non-display region NDA.

Although not shown, the resin layer RSL shown in FIGS. 6A and 6B, as in the resin layer RSL shown in FIGS. 5A to 5D, may include a first portion PPT and a second portion PP2 which have different thicknesses. For the first portion PPT and the second portion PP2 of the resin layer RSL, the same descriptions described with reference to FIGS. 5A to 5D may be applied.

In FIGS. 6A and 6B, a cross-sectional shape corresponding to the first portion PPT of the resin layer RSL has been described as an example, but the same descriptions with reference to FIGS. 5A to 5D may be applied to a cross-sectional shape corresponding to the second portion PP2 of the resin layer RSL, except that the resin layer RSL includes the first to third resin portions PTT, PT2, and PT3.

Figure 7A:
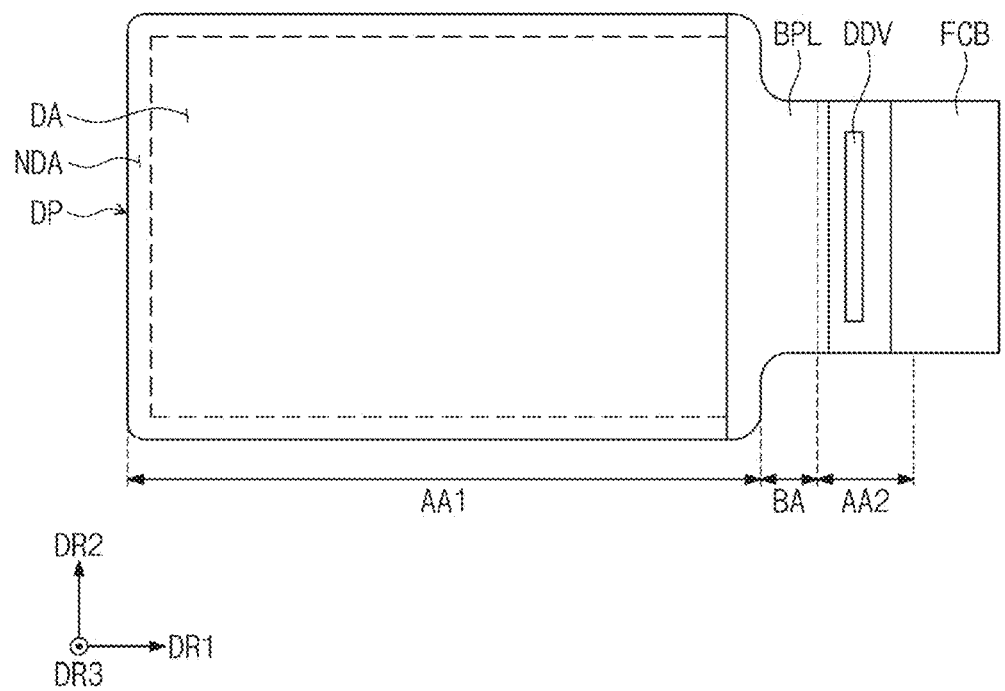
FIGS. 7A to 7N are views showing some processes in a method for manufacturing a display device according to an embodiment of the present invention.

Hereinafter, a method for manufacturing a display device according to an embodiment of the present invention will be described with reference to the drawings. FIGS. 7A to 7N mainly show a process of forming a window WP in a method for manufacturing a display device according to an embodiment of the present invention.

FIGS. 7A to 7N are views showing some processes in a method for manufacturing a display device according to an embodiment of the present invention. FIGS. 7A to 7N are views sequentially showing a method for manufacturing a display device according to an embodiment of the present invention. Hereinafter, in the describing of the method for manufacturing a display device according to an embodiment with reference to FIGS. 7A to 7N, the same reference numerals are given to components that are the same as the components described above, and detailed descriptions thereof will be omitted.

Figure 7B:
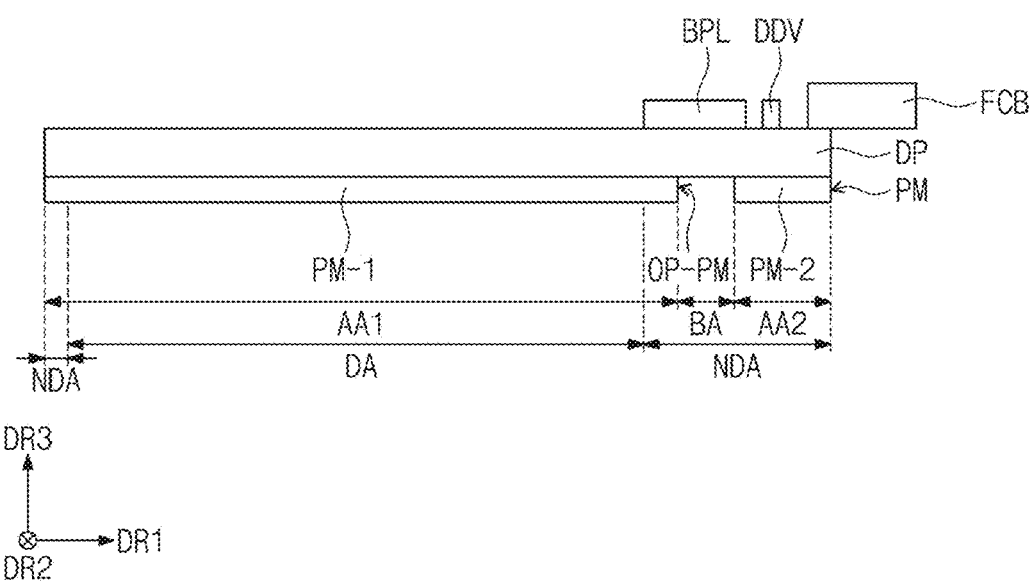

Referring to FIGS. 7A and 7B, the method for manufacturing a display device according to an embodiment may include preparing a display panel DP. The display panel DP may include a display region DA and a non-display region NDA adjacent to the display region DA. The display panel DP may include a first region AA1, a bending region BA, and a second region AA2, which are arranged along the first direction DR1. The display region DA of the display panel DP may be defined in the first region AA1. The display region DA may correspond to the transmission region TA of the display device DD shown in FIG. 1A. The non-display region NDA of the display panel DP may be defined by a region excluding the display region DA defined in the first region AA1, the bending region BA, and the second region AA2. A portion of the non-display region NDA, which is defined in the first region AA1 may correspond to the light blocking region BZA of the display device DD shown in FIG. 1A.

The driving chip DDV and the printed circuit board FCB may be disposed on the second region AA2 of the display panel DP. The printed circuit board FCB may be disposed on the second region AA2 to be spaced apart from the driving chip DDV. A panel protection member PM may be disposed below the display panel DP. The panel protection member PM may be disposed to overlap the first region AA1 and the second region AA2, and may be disposed not to overlap the bending region BA in a plan view.

Although not shown, an adhesive layer bonding the display panel DP and the panel protection member PM may be further disposed between the display panel DP and the panel protection member PM. For example, the adhesive layer may include a first portion disposed between the first region AA1 of the display panel DP and a first protection member PM-1, and a second portion disposed between the second region AA2 of the display panel DP and a second protection member PM-2. However, the embodiment of the present invention is not limited thereto.

In an embodiment, the preparing of the display panel DP may further include disposing a bending protection layer BPL on the display panel DP. The bending protection layer BPL overlapping at least the bending region BA may be disposed on the display panel DP. The bending protection layer BPL may be disposed on a portion of the first region AA1, the being region BA, and a portion of the second region AA2. The bending protection layer BPL may overlap a portion of the non-display region NDA defined in the first region AA1 in a plan view. However, unlike what is shown, the bending protection layer BPL may overlap only the bending region BA.

Figure 7C:
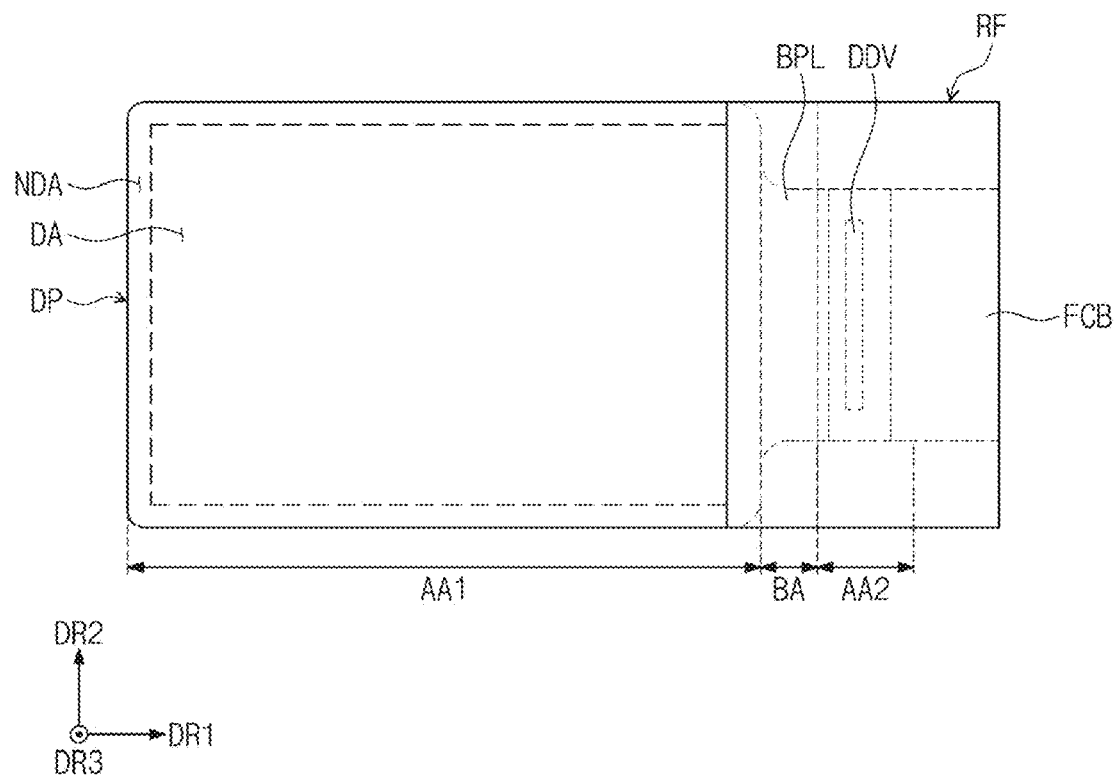
Figure 7D:
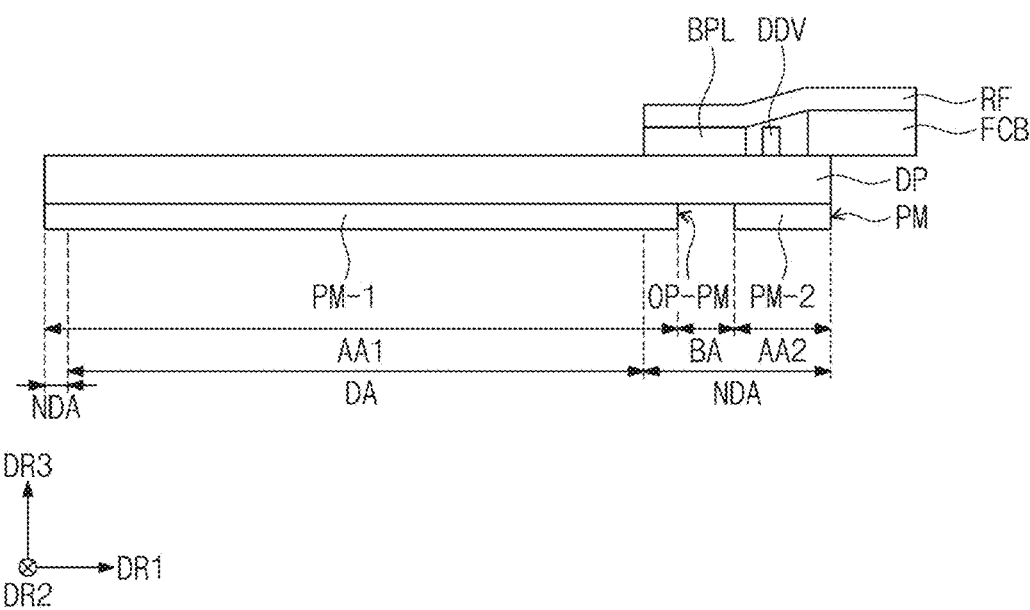

FIGS. 7C and 7D show a process of disposing a release film RF on the display panel DP. The release film RF may be a component for protecting the driving chip DDV and the printed circuit board FCB disposed on the display panel DP. The release film RF may be a component preventing the resin coating layer RCL (FIG. 7J) from moving off to the bending region BA and the second region AA2 and damaging the driving chip DDV and the printed circuit board FCB in a process of pressing a resin coating layer RCL (FIG. 7J) which will be described later.

As shown in FIGS. 7C and 7D, the release film RF may be disposed on at least the bending region BA. A length of the release film RF in the second direction DR2 may be substantially equal to a length of the first region AA1 of the display panel DP in the second direction DR2. However, the embodiment of the present invention is not limited thereto.

The release film RF may overlap the first region AA1 in a plan view, the bending region BA, and the second region AA2. The release film RF may be disposed on the bending protection layer BPL. The release film RF may be disposed on the bending protection layer BPL, the driving chip DDV, and the printed circuit board FCB. The release film RF may cover an upper surface of the bending protection layer BPL and an upper surface of the printed circuit board FCB. The release film RF may entirely cover the upper surface of the bending protection layer BPL and the upper surface of the printed circuit board FCB.

Figure 7E:
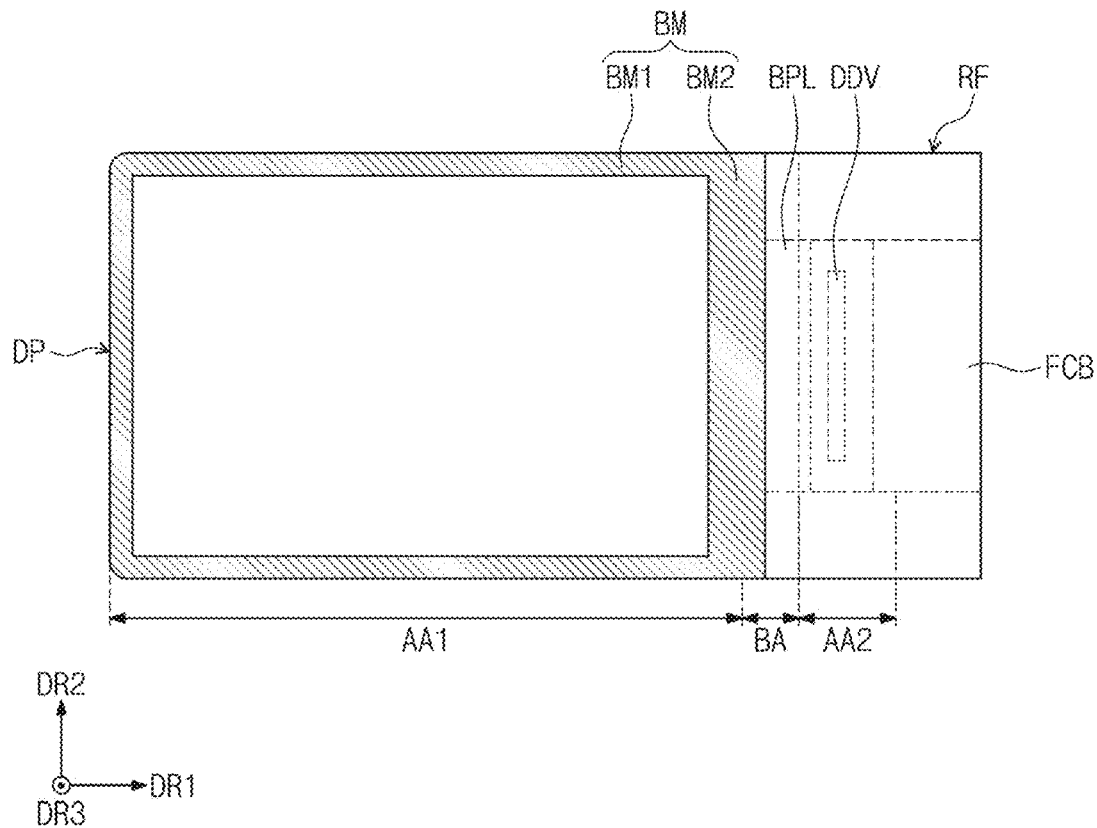
Figure 7F:
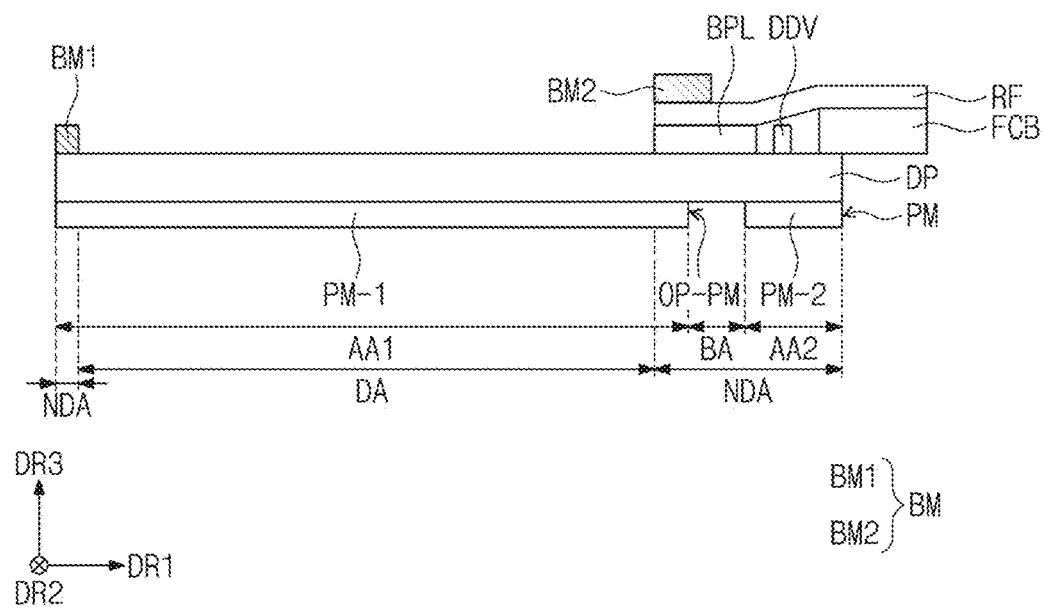

FIGS. 7E and 7F show a process of forming a light blocking pattern BM on the display panel DP. The light blocking pattern BM may be formed on the display panel DP. A method for forming the light blocking pattern BM is not particularly limited, but the light blocking pattern BM may be formed through inkjet printing, a screen printing process, or the like.

The light blocking pattern BM may be formed on the display panel DP to overlap the non-display region NDA defined in the first region AAT. In addition, the light blocking pattern BM may be formed on the display panel DP to overlap a portion of the bending region BA in a plan view. The light blocking pattern BM may be formed on the display panel DP and the release film RE. The light blocking pattern BM may include a first light blocking portion BM1 formed in a portion where the release film RF is not disposed on the first region AA1, and a second light blocking portion BM2 formed on the release film RF on the first region AA1 and the bending region BA.

The first light blocking portion BM1 and the second light blocking portion BM2 may be formed to have a constant thickness in the third direction DR3. The first light blocking portion BM1 and the second light blocking portion BM2 may have substantially the same thickness with respect to the third direction DR3. The first light blocking portion BM1 and the second light blocking portion BM2 may be formed on different planes. As the second light blocking portion BM2 is formed on the release film RF, the first light blocking portion BM1 and the second light blocking portion BM2 may be formed on different planes. The distance from the upper surface of the display panel DP to the upper surface of the second light blocking portion BM2 may be greater than the distance from the upper surface of the display panel DP to the upper surface of the first light blocking portion BM1.

Figure 7G:
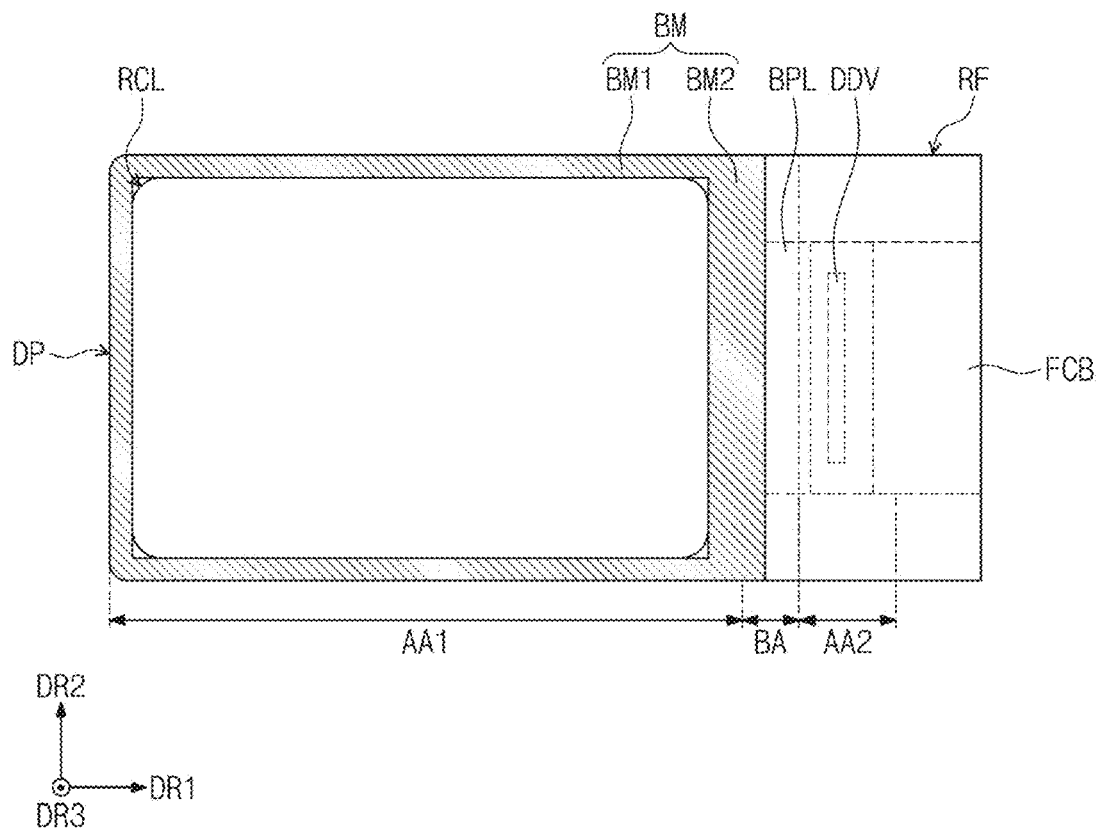
Figure 7H:
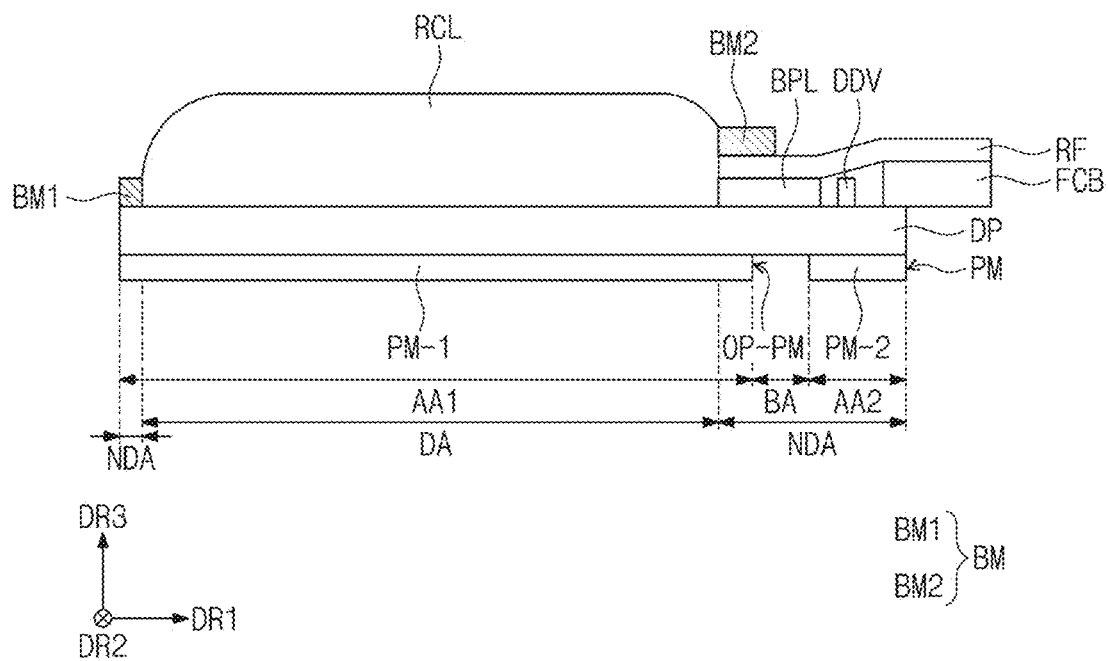

FIGS. 7G and 7H show a process of forming a resin coating layer RCL by applying a resin onto the display panel DP. Referring to FIGS. 7G and 7H, the resin coating layer RCL may be formed by providing a resin in the first region AA1. A resin for forming the resin layers RSL (FIG. 7N) may be provided in the display region DA (FIG. 7C), which is a region where the light blocking pattern BM is not formed.

The resin may include at least one of an acrylic adhesive resin, a silicone-based adhesive resin, or a urethane-based adhesive resin. A resin composition may include uncured oligomers or monomers. The uncured oligomers or monomers may include a crosslinking reactive group. In addition, the resin may include an initiator and a curing agent. The initiator may be a thermal initiator or a photo-initiator. The resin is provided in the form of liquid, and the resin coating layer RCL may be a liquid coating layer before being cured.

Figure 7I:
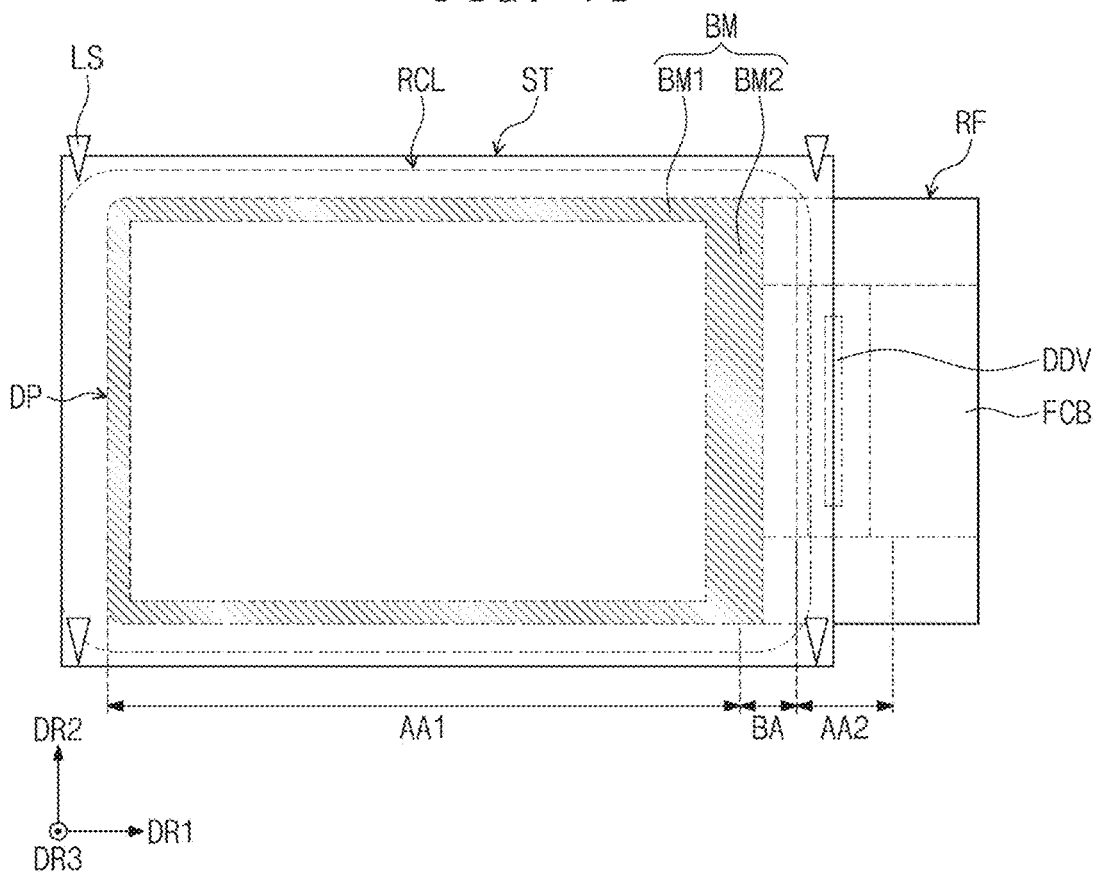
Figure 7J:
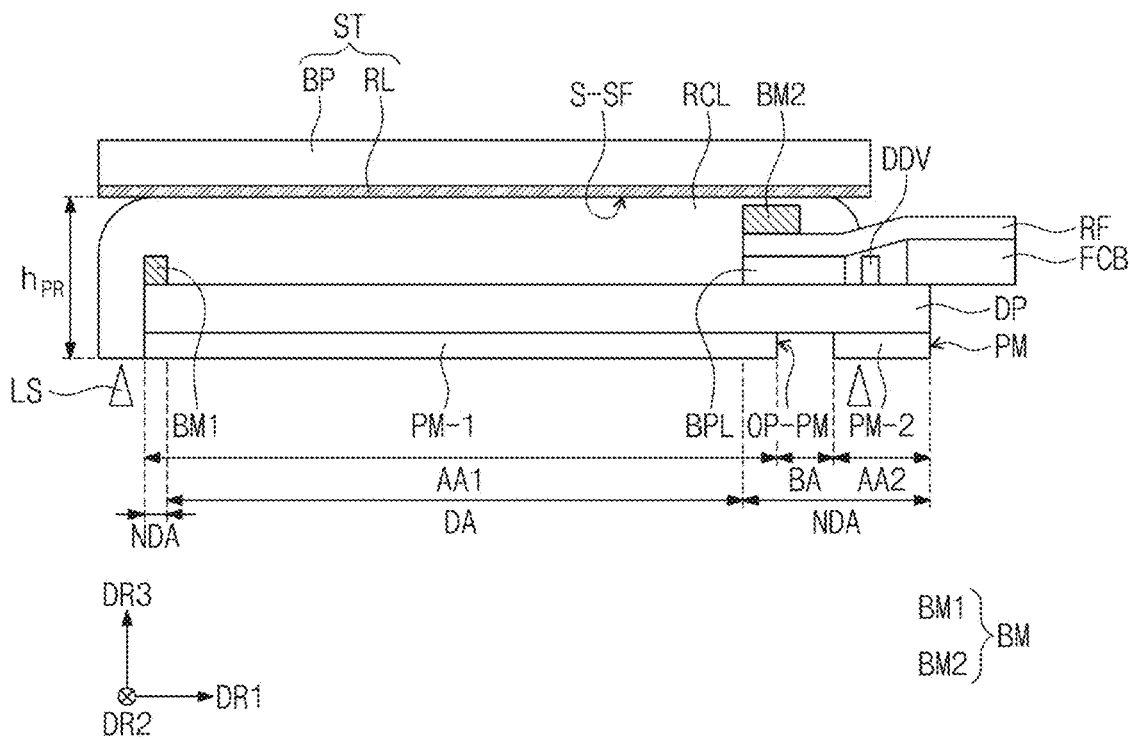
Figure 7K:
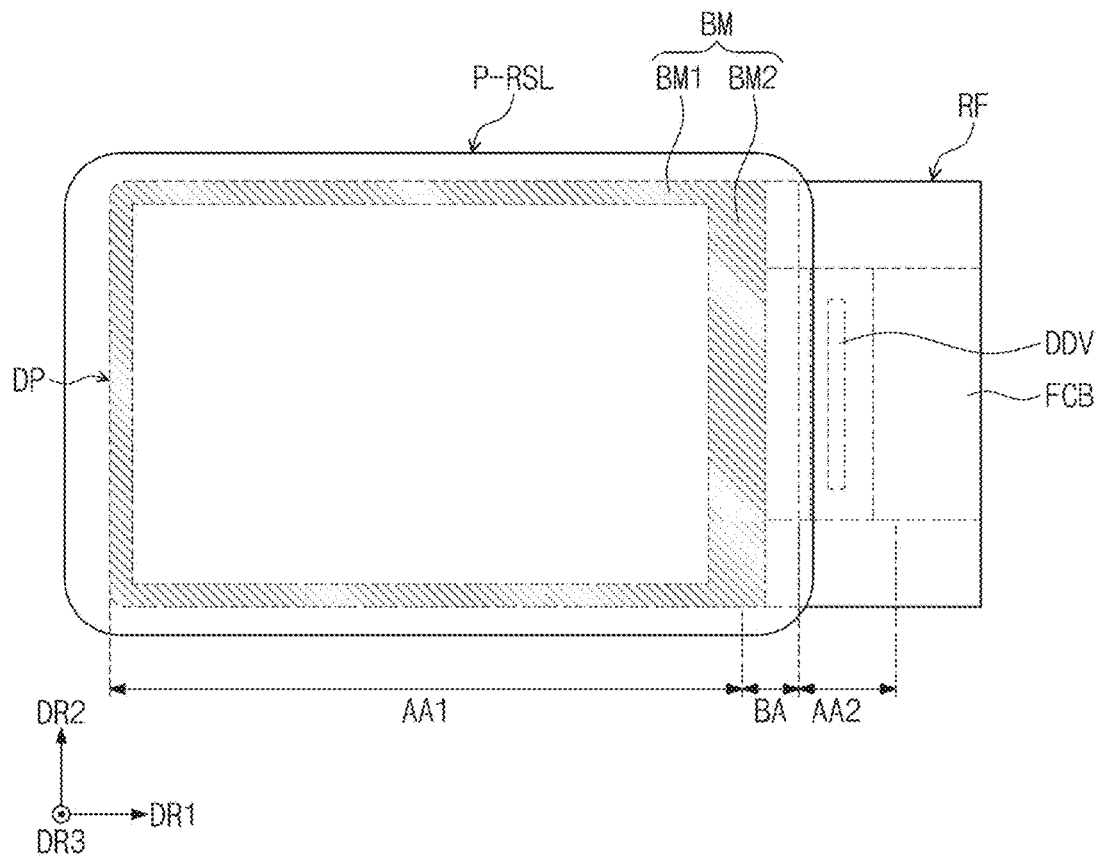

FIGS. 7I and 7J are views schematically showing a process of pressing the resin coating layer RCL.

Referring to FIGS. 7I and 7J, the pressing of the resin coating layer RCL may be a process of pressing an upper surface of the resin coating layer RCL, using a stamp ST. The pressing direction of the stamp ST is the third direction DR3, and the resin coating layer RCL may be pressed at a constant pressure condition from an upper side of the resin coating layer RCL.

In the pressing of the resin coating layer RCL, at least one surface of the stamp ST may be in contact with the resin coating layer RCL. A lower surface S-SF of the stamp ST may contact the resin coating layer RCL. The stamp ST may include a base member BP and a release layer RL. The release layer RL may be disposed below the base member BP. For example, a release material may be applied to a lower surface of the base member BP. Accordingly, the release layer RL may be formed below the base member BP. A lower surface of the release layer RL may correspond to the lower surface S-SF of the stamp ST. In the pressing of the resin coating layer RCL, the release layer RL of the stamp ST may contact the resin coating layer RCL.

The release layer RL is formed on one surface in contact with the resin coating layer RCL in the stamp ST, and accordingly, separating the stamp ST from a preliminary resin layer P-RSL (FIG. 7L) may be easily performed. The stamp ST may be easily separated from the preliminary resin layer P-RSL (FIG. 7I) through a release material.

The release material is not particularly limited as long as the material is commonly used in the art, but for example, an alkyd release agent, a silicone release agent, a fluorine release agent, an unsaturated ester release agent, a polyolefin release agent, or a wax release agent, or the like may be used. However, the embodiment of the present invention is not limited thereto. In another embodiment, the release material may include at least one of carnauba wax or polyalkyl siloxane.

As shown in FIG. 7J, the lower surface S-SF of the stamp ST may contact the resin coating layer RCL. When the resin coating layer RCL is pressed using the stamp ST, a shape corresponding to the lower surface S-SF of the stamp ST may be transferred to the resin coating layer RCL. The lower surface S-SF of the stamp ST may be parallel to a plane defined by the first direction DR1 and the second direction DR2. Accordingly, the upper surface of the resin coating layer RCL pressed with the stamp ST may be formed to be parallel to a plane defined by the first direction DR1 and the second direction DR2.

In the pressing of the resin coating layer RCL, the stamp ST may be fixed to a predetermined height on the display panel DP. A height $h_{PR}$ of the stamp ST may be measured through a displacement sensor LS and fixed at a constant height. The displacement sensor LS may be a sensor capable of measuring the height $h_{PR}$ of the stamp ST. For example, the displacement sensor LS may irradiate the lower surface S-SF of the stamp ST with light and receive light reflected from the lower surface S-SF of the stamp ST to obtain information on the height $h_{PR}$ of the stamp ST. In this case, a method for measuring distance may be variously applied according to a sensing method. For example, an amount of light received by the displacement sensor LS may be used for measurement. However, the embodiment of the present invention is not limited thereto.

The displacement sensor LS may constantly maintain the height of the stamp ST in the third direction DR3 in the pressing of the resin coating layer RCL. For example, the height from the lower surface of the panel protection member PM to the lower surface S-SF of the stamp ST may be constantly maintained in the third direction DR3.

Figure 7L:
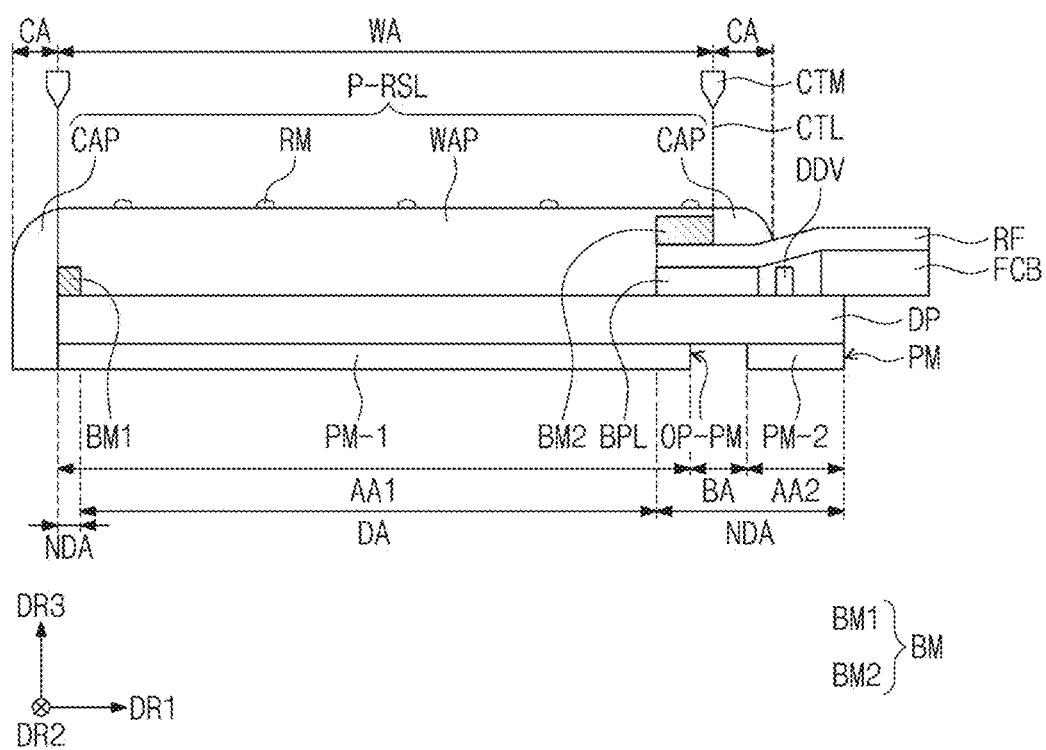

The method for manufacturing a display device according to an embodiment of the present invention may include a process of applying light or heat to the resin coating layer RCL to form a preliminary resin layer P-RSL (FIG. 7L). Hereinafter, applying light to the resin coating layer RCL will be described as an example. In a process of curing of the resin coating layer RCL, light may be applied to the entire resin coating layer RCL.

In the method for manufacturing a display device according to an embodiment, the curing of the resin coating layer RCL may be performed after the resin coating layer RCL is pressed with a stamp ST. The curing of the resin coating layer RCL may be performed after the pressing of the resin coating layer RCL with the stamp ST. The curing of the resin coating layer RCL may be concurrently performed when the resin coating layer RCL is pressed with the stamp ST. The resin coating layer RCL may be cured by irradiating the resin coating layer RCL with light, for example, ultraviolet light, when the resin coating layer RCL is pressed with the stamp ST. Light may be applied to the resin coating layer RCL through the stamp ST from a light source disposed on the stamp ST. The stamp ST may be formed of a material having high light transmittance. The stamp ST may have high ultraviolet light transmittance. The resin coating layer RCL, which is a liquid coating layer, may be converted into a solid preliminary resin layer P-RSL (FIG. 7L) by light provided through the stamp ST. In an embodiment, the pressing of the resin coating layer RCL and the curing of the resin coating layer RCL may be concurrently performed.

As the resin coating layer RCL is pressed with the stamp ST, the resin coating layer RCL may move to a region other than the display region DA. When the resin coating layer RCL is pressed, the resin coating layer RCL may overflow out of the display region DA. As the resin coating layer RCL is pressed before the resin coating layer RCL is cured, the liquid resin coating layer RCL may overflow out of the display panel DP. Thereafter, the pressed resin coating layer RCL may be cured to form the preliminary resin layer P-RSL shown in FIGS. 7K and 7L.

FIGS. 7K and 7L are views schematically showing a process of cutting the preliminary resin layer P-RSL.

Referring to FIGS. 7K and 7L, a window region WA and a cutting region CA adjacent to the window region WA may be defined in the preliminary resin layer P-RSL. In an embodiment, the window region WA may be a region corresponding to the resin layer RSL of the window WP shown in FIG. 5A, and the cutting region CA may be a portion to be removed after a display device is manufactured. The cutting region CA may be a region adjacent to an edge of the preliminary resin layer P-RSL in a plan view.

The preliminary resin layer P-RSL may include a window portion WAP overlapping the window region WA and a cutting portion CAP overlapping the cutting region CA in a plan view.

The resin layer RSL (FIG. 7N) may be formed by cutting the preliminary resin layer P-RSL. Upon the cutting of the preliminary resin layer P-RSL, a cutting line CTL may be defined at a border line between the window region WA and the cutting region CA. That is, the cutting line CTL is defined at an outer portion of the cutting region CA, and a portion of the preliminary resin layer P-RSL that overlaps the cutting region CA may be removed. After the cutting of the preliminary resin layer P-RSL, the window portion WAP overlapping the window region WA of the preliminary resin layer P-RSL may become the resin layer RSL, and the cutting portion CAP overlapping the cutting region CA of the preliminary resin layer P-RSL in a plan view may be removed.

The process of cutting the preliminary resin layer P-RSL may be performed using a cutting member CTM. The preliminary resin layer P-RSL may be cut along the cutting line CTL using the cutting member CTM. For example, the cutting member CTM may be a laser device. The cutting region CA of the preliminary resin layer P-RSL may be separated from the window region WA through a cutting process. The window region WA may be separated from the cutting region CA and disposed on the display panel DP. The window region WA may correspond to the resin layer RSL (FIG. 7N).

The cutting line CTL may be set along a border region of the display panel DP. The resin layer RSL (FIG. 7N) may be formed by cutting the preliminary resin layer P-RSL. As the preliminary resin layer P-RSL is cut along the border region of the display panel DP, the resin layer RSL (FIG. 7N) may have side surfaces aligned with the display panel DP.

A residual release material RM may be disposed on the preliminary resin layer P-RSL. The residual release material RM may be disposed on an upper surface of the preliminary resin layer P-RSL. The residual release material RM may be a residual material remaining after the stamp ST (FIG. 7J) is separated from the preliminary resin layer P-RSL. That is, upon the removing of the stamp ST shown in FIGS. 7I and 7J, a portion of the residual release material RM may remain as a residue without being completely removed.

Figure 7M:
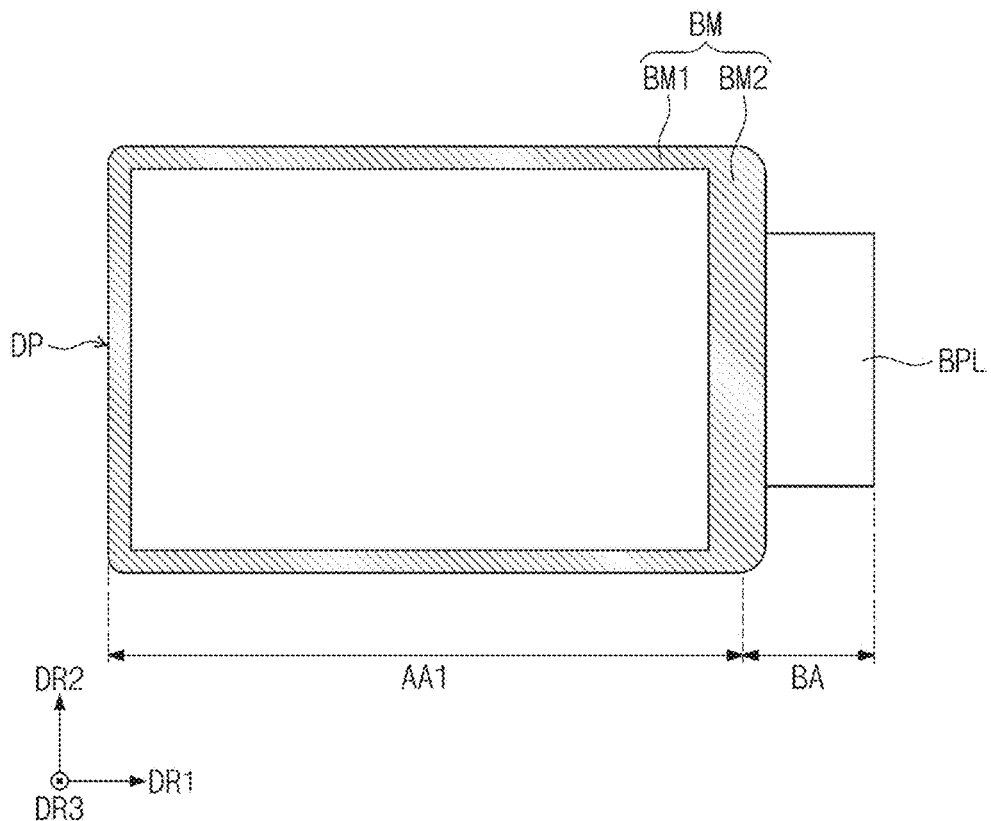
Figure 7N:
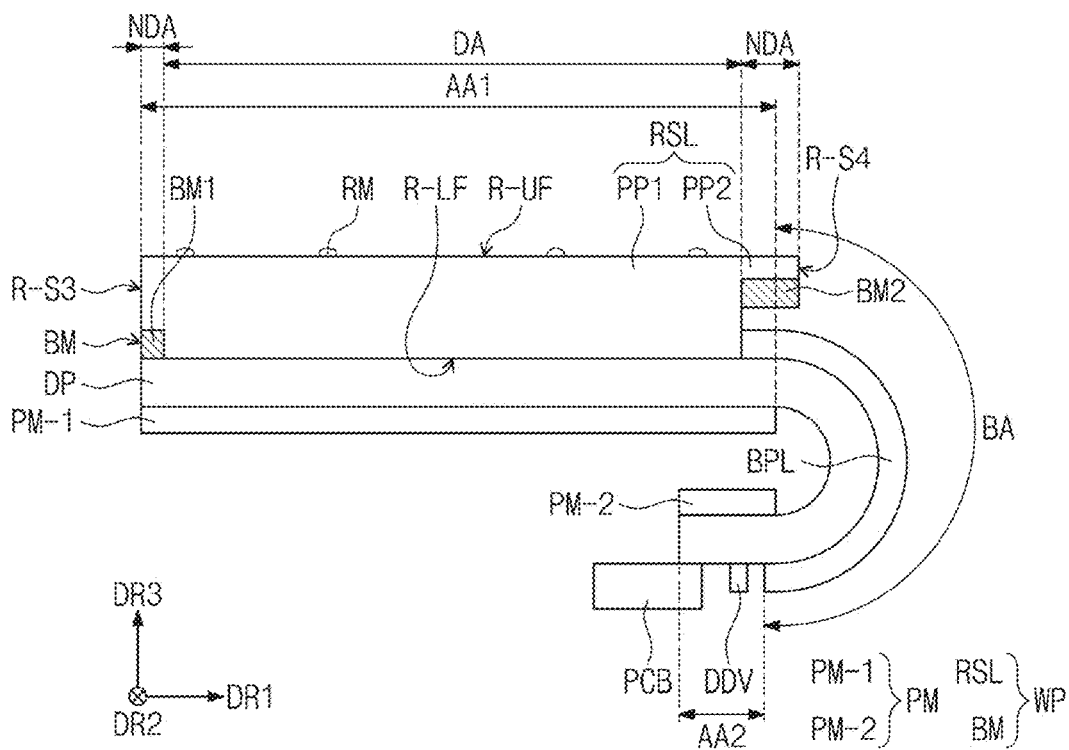

Referring to FIGS. 7M and 7N, the resin layer RSL may be formed after the cutting of the preliminary resin layer P-RSL. After the cutting of the preliminary resin layer P-RSL, the release films RF (FIG. 7K) disposed on the display panel DP may be removed. After the removing of the release films RF (FIG. 7K), in a region where the second light blocking portion BM2 is disposed, the resin layer RSL and the display panel DP may be spaced apart from each other in the third direction DR3.

The resin layer RSL may have at least one side surface aligned with the display panel DP. For example, a third side surface R-S3 and a fourth side surface R-S4 of the resin layer RSL, which face each other in the first direction DR1 may be formed. Although not shown, the first side surface R-S1 (FIG. 4) and the second side surface R-S2 (FIG. 4) of the resin layer RSL, which face each other in the second direction DR2 may be formed. The first to fourth side surfaces R-S1, R-S2, R-S3, and R-S4 may be formed through the cutting process described with reference to FIGS. 7K and 7L. The first to fourth side surfaces R-S1, R-S2, R-S3, and R-S4 may each be parallel to the third direction DR3.

In an embodiment, the first to third side surfaces R-S1, R-S2, and R-S3 may be aligned with a corresponding side surface among the respective side surfaces of the display panel DP. The fourth side surface R-S4 may overlap the bending region BA of the display panel DP in a plan view. The display panel DP may include one end and the other end, which are spaced apart along the first direction DR1. One end of the display panel DP may be aligned with the third side surface R-S3. The other end of the display panel DP may be non-aligned with the fourth side surface R-S4. Each of the aligned side surfaces of the resin layer RSL and the display panel DP may be substantially parallel to the third direction DR3.

Although FIGS. 7A to 7N show, as an example, that no other components are present between the display panel DP and the window WP, the embodiment of the present invention is not limited thereto, and various functional layers may be disposed between the display panel DP and the window.

The resin layer RSL may be disposed on the display panel DP. The resin layer RSL may overlap the first region AA1 and the bending region BA of the display panel DP in a plan view. The resin layer RSL may include a first portion PP1 overlapping the first region AA1 of the display panel DP, and a second portion PP2 extending from the first portion PP1 to the first direction DR1. The first portion PP1 and the second portion PP2 may have different thicknesses and may be disposed on the display panel DP. For example, a first thickness $d_{W1}$ (FIG. 5A) of the first portion PP1 of the resin layer RSL may be greater than a second thickness $d_{W2}$ (FIG. 5A) of the second portion PP2. A thickness of the second portion PP2 in the third direction DR3 may be smaller than a thickness of the first portion PP1 in the third direction DR3 (i.e., thickness direction).

The resin layer RSL may include an upper surface R-UF parallel to a plane defined by the first direction DR1 and the second direction DR2. The upper surface R-UF of the resin layer RSL may define an upper surface of the window WP. A residual release material RM may be disposed on the resin layer RSL. The residual release material RM may be disposed on the upper surface R-UF of the resin layer RSL.

The light blocking pattern BM may be disposed on the display panel DP to overlap the non-display region NDA of the display panel DP in a plan view. FIGS. 7A to 7N show an embodiment including a window WP having a light blocking pattern BM. However, the embodiment of the present invention is not limited thereto, and in the case of the display device DD (FIG. 1A) in which the light blocking region BZA (FIG. 1A) is omitted, the light blocking pattern BM may be omitted. In this case, the upper surface of the window WP defining an upper surface of the display device DD (FIG. 1A) may entirely correspond to the transmission region TA (FIG. 1A).

Figure 8A:
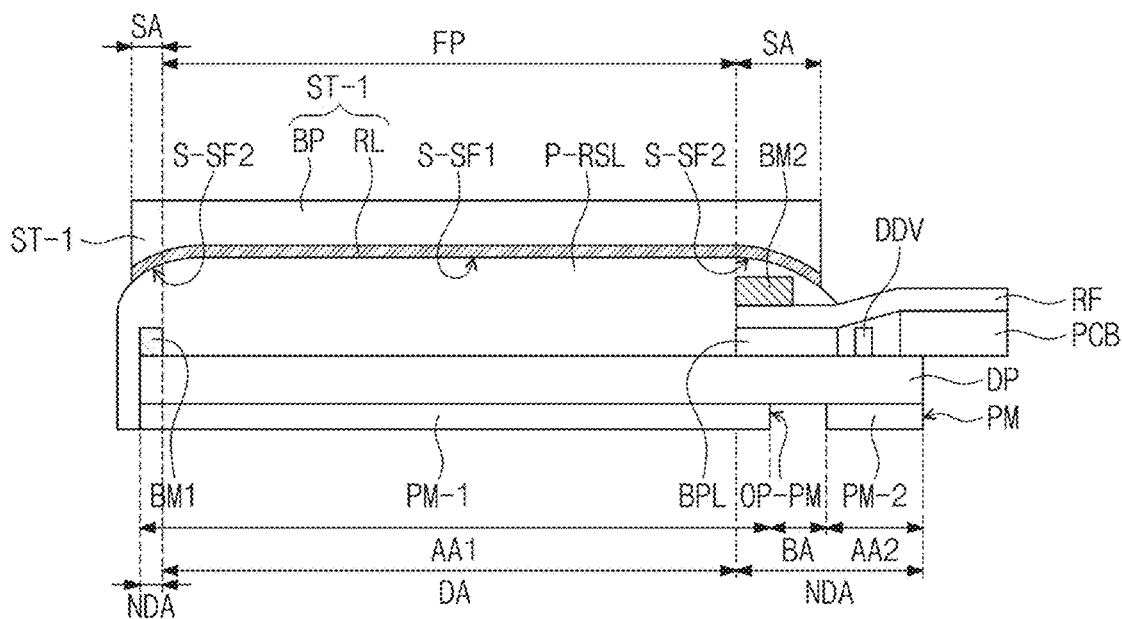
FIGS. 8A to 8C are views showing some processes in a method for manufacturing a display device according to an embodiment of the present invention.
Figure 8B:
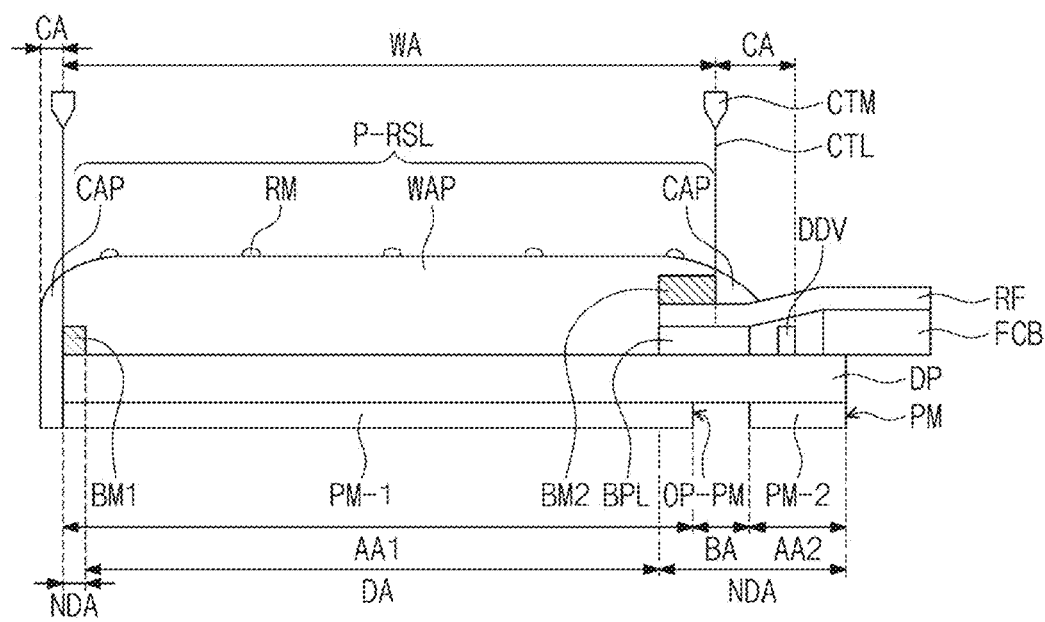
Figure 8C:
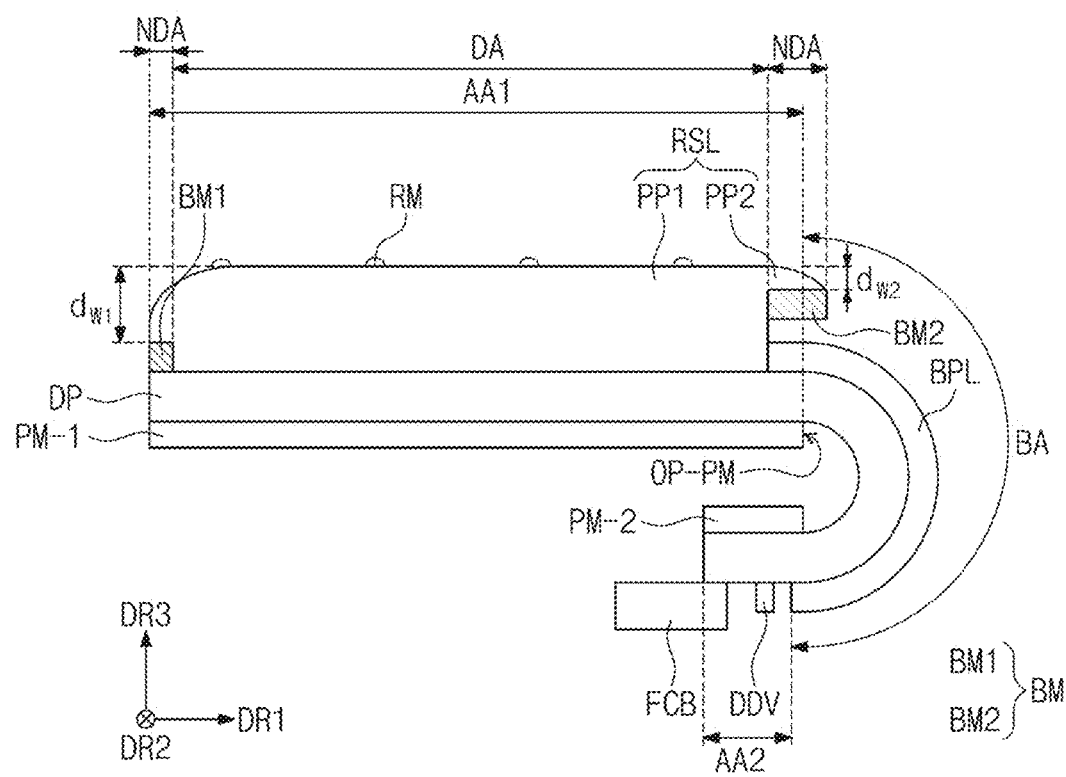

FIGS. 8A to 8C are cross-sectional views showing a method for manufacturing a display device according to an embodiment of the present invention. Hereinafter, in describing the method for manufacturing a transparent electrode according to an embodiment with reference to FIGS. 8A to 8C, the same reference numerals are given to components that are the same as the components described above, and detailed descriptions thereof will be omitted.

Referring to FIG. 8A, the window WP (FIG. 1B) may be manufactured using a stamp ST-1. The stamp ST-1 shown in FIG. 8A may have a different shape compared to the stamp ST shown in FIGS. 7I and 7J.

Referring to FIGS. 8A to 8C, the pressing of the resin coating layer RCL may be a process of pressing an upper surface of the resin coating layer RCL, using the stamp ST-1. The pressing direction of the stamp ST-1 is the third direction DR3, and the resin coating layer RCL may be pressed at a constant pressure condition from an upper side of the resin coating layer RCL.

In the pressing of the resin coating layer RCL, at least one surface of the stamp ST-1 may be in contact with the resin coating layer RCL. As shown in FIG. 8A, the lower surface S-SF of the stamp ST-1 may contact the resin coating layer RCL. The stamp ST-1 may include a base member BP and a release layer RL. The release layer RL may be disposed below the base member BP. A lower surface of the release layer RL may correspond to the lower surface S-SF of the stamp ST-1. In the pressing of the resin coating layer RCL, the release layer RL of the stamp ST-1 may contact the resin coating layer RCL. The stamp ST-1 may include a flat portion FP and a side portion SA extending from the flat portion FP. The lower surface of the stamp ST-1 may include a first surface S-SF1 corresponding to the flat portion FP and a second surface S-SF2 corresponding to the side portion SA. The first surface S-SF1 may be parallel to a plane defined by the first direction DR1 and the second direction DR2. The second portion S-SF2 may extend from the first portion S-SF1. The second portion S-SF2 may be bent from the first portion S-SF1. That is, the second surface S-SF2 may extend from the first surface S-SF1 and may have a bent shape with a constant radius of curvature. The flat portion FP of the stamp ST-1 may provide the first surface S-SF1, and the side portion SA may provide the second surface S-SF2.

Referring to FIGS. 8A and 8B, after pressing the resin coating layer RCL with the stamp ST-1, a process of curing the resin coating layer RCL may be performed. The curing of the resin coating layer RCL may be performed after the pressing of the resin coating layer RCL with the stamp ST-1. The curing of the resin coating layer RCL may be concurrently performed when the resin coating layer RCL is pressed with the stamp ST-1.

When the resin coating layer RCL is pressed and cured using the stamp ST-1, a shape corresponding to the lower surface S-SF of the stamp ST-1 may be transferred to the resin coating layer RCL. The lower surface S-SF of the stamp ST-1 may include a curved surface overlapping the non-display region NDA. Accordingly, the upper surface of the resin coating layer RCL, which is pressed with the stamp ST-1 may be transferred to include a curved surface overlapping the non-display region NDA in a plan view.

Referring to FIGS. 8B and 8C, a preliminary resin layer P-RSL may be formed after the curing of the resin coating layer RCL. A window region WA and a cutting region CA adjacent to the window region WA may be defined in the preliminary resin layer P-RSL. The preliminary resin layer P-RSL may include a window portion WAP overlapping the window region WA and a cutting portion CAP overlapping the cutting region CA.

The resin layer RSL may be formed by cutting the preliminary resin layer P-RSL. Upon the cutting of the preliminary resin layer P-RSL, a cutting line may be defined at a border line between the window region WA and the cutting region CA. In the cutting of the preliminary resin layer P-RSL, a portion of the preliminary resin layer P-RSL that overlaps the cutting region CA may be removed. After the cutting of the preliminary resin layer P-RSL, the window portion WAP overlapping the window region WA of the preliminary resin layer P-RSL may become the resin layer RSL, and the cutting portion CAP overlapping the cutting region CA of the preliminary resin layer P-RSL may be removed.

Referring to FIGS. 8C, the resin layer RSL may be formed after the cutting of the preliminary resin layer P-RSL. The resin layer RSL may include a first portion PP1 overlapping the first region AA1 of the display panel DP in a plan view, and a second portion PP2 extending from the first portion PP1 to the first direction DR1. In the resin layer RSL, a thickness of the first portion PP1 may be greater than a thickness of the second portion PP2.

The resin layer RSL may include an upper surface spaced apart from the display panel DP. The upper surface of the resin layer RSL overlapping the display region DA in a plan view may be parallel to a plane defined by the first direction DR1 and the second direction DR2. The upper surface of the resin layer RSL overlapping the non-display region NDA in a plan view may include a curved surface. Although not shown, a shape of the resin layer RSL may be the same as a shape of the resin layer RSL of the window WP shown in FIGS. 6A and 6B. For example, the resin layer RSL shown in FIGS. 6A and 6B may include a first resin portion PT1, a second resin portion PT2, and a third resin portion PT3.

A residual release material RM may be disposed on the resin layer RSL. The residual release material RM may be disposed on the upper surface of the resin layer RSL.

Figure 9A:
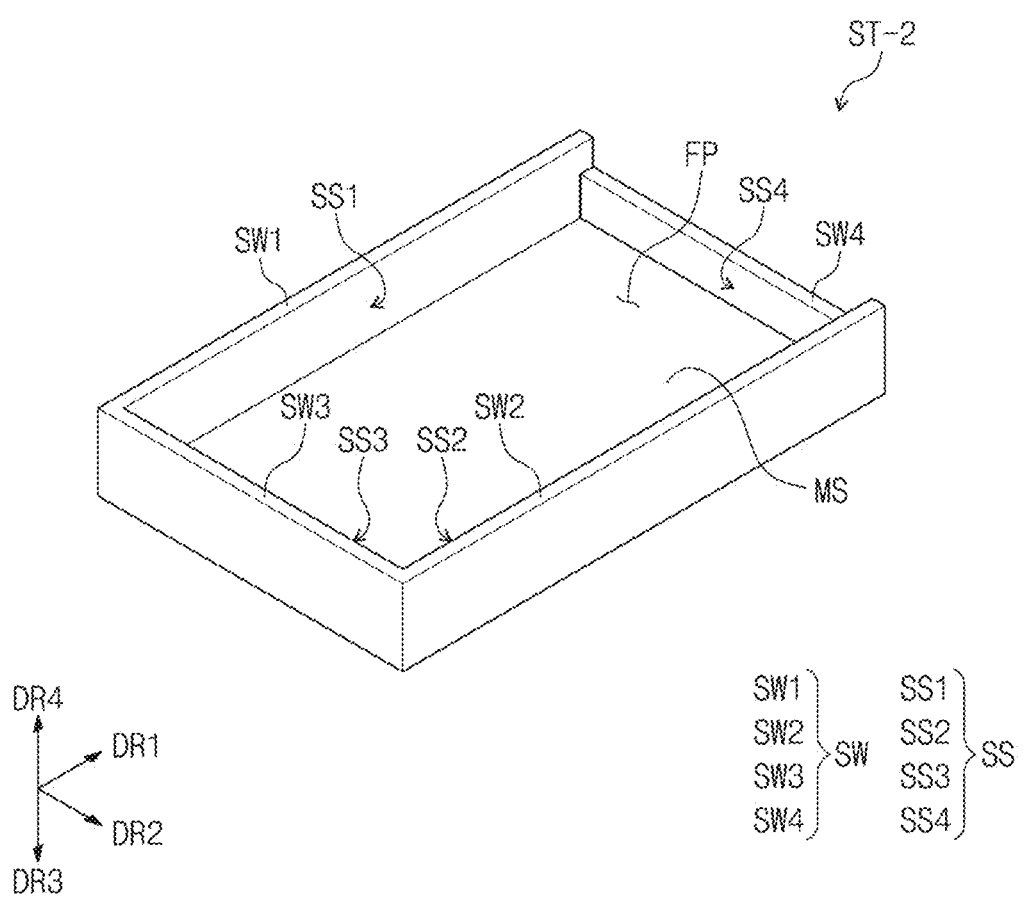

FIGS. 9A and 9B are cross-sectional views showing a method for manufacturing a display device according to an embodiment of the present invention. Hereinafter, in describing the method for manufacturing a transparent electrode according to an embodiment with reference to FIGS. 9A and 9B, the same reference numerals are given to components that are the same as the components described above, and detailed descriptions thereof will be omitted.

Referring to FIG. 9A, the window WP (FIG. 1B) may be manufactured using a stamp ST-2. The stamp ST-2 shown in FIG. 9A may have a different shape compared to the stamp ST shown in FIGS. 7I and 7J. The stamp SP-2 may include a flat portion FP and a side portion SW extending from the flat portion FP and perpendicular to the flat portion FP. The stamp ST-2 may include at least one side portion SW. The stamp ST-2 may include a side portion SW extending from at least one side of the flat portion FP. In FIG. 9A, the stamp ST-2 including four side portions SW1, SW2, SW3, and SW4 is shown as an example. In the present embodiment, the term "flat portion FP and side portion SW" defines the stamp ST-2 as a plurality of portions divided by shape.

The flat portion FP may be parallel to a plane defined by the first direction DR1 and the second direction DR2. The side portions SW1, SW2, SW3, and SW4 may have a shape extending from the flat portion FP and perpendicular to the flat portion FP. That is, the flat portion FP may be parallel to a plane defined by the first direction DR1 and the second direction DR2, and the side portions SW1, SW2, SW3, SW4 may be parallel to the third direction DR3. In an embodiment, the stamp ST-2 may include a molding space MS defined by the flat portion FP and the side portion SW. The molding space MS may indicate a space for processing the resin coating layer RCL. The molding space MS defined in the stamp ST-2 may correspond to the shape of the resin layer RSL shown in FIG. 5A.

Referring to FIGS. 9A and 9B, the stamp ST-2 may include at least one surface in contact with the resin coating layer RCL. The flat portion FP of the stamp ST-2 provides a first surface BF, and the side portions SW1, SW2, SW3, SW4 provide a second surface SS. The first surface BF and the second surface SS may contact the resin coating layer RCL. The side portions SW1, SW2, SW3, and SW4 may include a first side portion SW1 and a second side portion SW2, which are spaced apart in the second direction DR2, and a third side portion SW3 and a fourth side portion SW4, which are spaced apart in the first direction DR1. The first side portion SW1 may provide a first side surface SS1, the second side portion SW2 may provide a second side surface SS2, the third side portion SW3 may provide a third side surface SS3, and the fourth side portion SW4 may provide a fourth side surface SS4. The first to fourth side surfaces SS1, SS2, SS3, and SS4 may be connected to each other to define the second surface SS.

As shown in FIGS. 9A and 9B, a molding space MS may be defined by the flat portion FP and the side portions SW1, SW2, SW3, SW4 of the stamp ST-2. The stamp ST-2 may press the resin coating layer RCL. The resin coating layer RCL may be disposed in the molding space MS defined in the stamp ST-2. The pressed resin coating layer RCL may fill the molding space MS of the stamp ST-2. The pressed resin coating layer RCL may fill the entire molding space MS of the stamp ST.

In the pressing of the resin coating layer RCL using the stamp ST-2, an outer portion of the resin coating layer RCL may be cut by the molding space MS defined in the stamp ST-2. The stamp ST-2 may cut the cutting portion CAP adjacent to an edge of the resin coating layer RCL while pressing the resin coating layer RCL. The cutting portion CAP may correspond to the cutting portion CAP shown in FIG. 7L.

As the molding space MS corresponding to the shape of the resin layer RSL shown in FIG. 5A is defined in the stamp ST-2, the cutting of the preliminary resin layer P-RSL described in FIG. 7L may be omitted in this method. The resin coating layer RCL is pressed by the molding space MS defined in the stamp ST-2 and at the same time the cut portion CAP adjacent to the edge is removed from the resin coating layer RCL, and accordingly, the cutting operation of the preliminary resin layer P-RSL may be omitted. Accordingly, the display device DD may have increased process efficiency.

In the pressing of the resin coating layer RCL, at least one surface of the stamp ST-2 may be in contact with the resin coating layer RCL. As shown in FIG. 8B, the first surface SSF-2 and the second surfaces SS1, SS2, SS3, and SS4 of the stamp ST-2 may contact the resin coating layer RCL. The stamp ST-2 may include a base member BP and a release layer RL. The release layer RL may be disposed below the base member BP. As shown in FIG. 9B, a release material may be applied onto a lower surface of the base member BP of the stamp ST-2. Accordingly, the release layer RL may be formed below the base member BP. A lower surface of the release layer RL may correspond to the first surface SSF-2 and the second surfaces SS1, SS2, SS3, and SS4 of the stamp ST-2. In the pressing of the resin coating layer RCL, the release layer RL of the stamp ST-2 may contact the resin coating layer RCL.

Thereafter, the resin coating layer RCL pressed with the stamp ST-2 may be cured to form the resin layer RSL (FIG. 5A) on the display panel DP. The curing of the resin coating layer RCL may be performed after the resin coating layer RCL is pressed with a stamp ST-2. After the pressing of the resin coating layer RCL with the stamp ST-2, the curing of the resin coating layer RCL may be performed. The curing of the resin coating layer RCL may be performed when the resin coating layer RCL is pressed with the stamp ST-2. After the resin coating layer RCL is sufficiently cured, the stamp ST-2 may be separated from the preliminary resin layer P-RSL (FIG. 7I). As the release layer RL of the stamp ST-2 comes into contact with the resin coating layer RCL, separating the stamp ST from the preliminary resin layer P-RSL (FIG. 7I) may be easily performed.

In the method for manufacturing a display device according to an embodiment of the present invention, a window is formed by directly applying a resin onto a display panel DP, and accordingly, defects that may takes place upon lamination of typical display panels and windows may be reduced. Accordingly, the display device may have increased process efficiency and process reliability.

The display device may include a window disposed on the display panel to constitute an exterior of the display device. Typically, a lamination method bonding a window and a display panel formed through a separate process has been used. For example, the window may be laminated on a front surface of the display panel, using an adhesive. However, in this method, bubbles or foreign substances may be generated between the display panel and the window, and the use of an adhesive may cause lifting and misalignment of the adhesive. When bubbles or foreign substances are formed between the display panel and the window, an appearance defect of the display device may be caused, and the quality of displayed images may deteriorate.

According to an embodiment of the present invention, a resin for forming a window WP is directly applied onto a display panel DP, and a lamination process for bonding the display panel DP and the window WP may thus be omitted. Accordingly, product quality deterioration due to the generation of bubbles or foreign substances that may be caused in the lamination process may be prevented, and since an adhesive is not used, lifting and misalignment of the adhesive may be prevented, resulting in increased process reliability and process efficiency of a display device.

When a method for manufacturing a display device according to an embodiment of the present invention is applied, a processing defect of the display device may be prevented, and process reliability and process efficiency may be increased.

A display device according to the embodiment of the present invention may have high quality and excellent reliability.

Although the present disclosure has been described with reference to a preferred embodiment of the present invention, it will be understood that the present invention should not be limited to these preferred embodiments but various changes and modifications can be made by those skilled in the art without departing from the spirit and scope of the present disclosure. Accordingly, the technical scope of the present invention is not intended to be limited to the contents set forth in the detailed description of the specification, but is intended to be defined by the appended claims.

What is claimed is:

1. A method for manufacturing a display device, the method comprising:
    preparing a display panel including a first region, a bending region, and a second region, which are arranged in a first direction;
    disposing a release film overlapping the bending region on the display panel;
    applying a resin onto the first region to form a resin coating layer;
    pressing the resin coating layer, using a stamp coated with a release material; and
    curing the resin coating layer to form a preliminary resin layer.

2. The method of claim 1, further comprising cutting the preliminary resin layer along a border of the display panel after the forming of the preliminary resin layer.

3. The method of claim 2, wherein after the cutting of the preliminary resin layer, a resin layer comprising a first portion and a second portion is formed, the first portion is disposed on the display panel and overlaps the first region, and the second portion extends from the first portion along the first direction and overlaps the bending region.

4. The method of claim 3, wherein the second portion has a smaller thickness than first portion.

5. The method of claim 3, wherein the resin layer comprises an upper surface spaced apart from the display panel, a lower surface adjacent to the display panel, and a side surface connecting the upper surface and the lower surface, wherein the upper surface is parallel to a plane defined by the first direction and a second direction crossing the first direction.

6. The method of claim 5, wherein the side surface is parallel to a third direction crossing the first direction and the second direction.

7. The method of claim 3, wherein the resin layer comprises an upper surface spaced apart from the display panel, and the upper surface of the resin layer includes a curved surface.

8. The method of claim 1, wherein the stamp comprises a certain surface in contact with the resin coating layer, and the certain surface is coated with the release material.

9. The method of claim 8, wherein the certain surface of the stamp is parallel to a plane defined by the first direction and a second direction crossing the first direction.

10. The method of claim 8, wherein the certain surface of the stamp comprises a first surface parallel to a plane defined by the first direction and a second direction crossing the first direction, and a second surface bent from the first surface.

11. The method of claim 1, wherein the stamp comprises a flat portion and a side portion perpendicular to the flat portion, and
    the stamp comprises a molding space defined by the flat portion and the side portion.

12. The method of claim 1, further comprising forming a light blocking pattern overlapping a portion of the display panel on the display panel before the applying of the resin.

13. The method of claim 12, wherein in the forming of the light blocking pattern, a first light blocking portion is formed to be disposed on the display panel and overlap the first region, and a second light blocking portion is formed to be disposed on the display panel and overlap the bending region.

14. The method of claim 13, wherein a distance between an upper surface of the display panel and an upper surface of the second light blocking portion is greater than a distance between the upper surface of the display panel and an upper surface of the first light blocking portion.

15. The method of claim 1, wherein in the preparing of the display panel, forming a bending protection layer on the display panel to overlap the bending region is performed, and
    the release film covers an upper surface of the bending protection layer.

16. The method of claim 1, wherein the pressing of the resin coating layer, and the curing of the resin coating layer to form the preliminary resin layer are concurrently performed.

17. The method of claim 1, further comprising removing the release film.

18. A method for manufacturing a display device, the method comprising:
    preparing a display panel having a transmission region and a light blocking region surrounding the transmission region, and including a bending region extending from a side of the light blocking region;
    disposing a release film overlapping the bending region on the display panel;
    forming a light blocking pattern overlapping the light blocking region;
    providing a resin on the display panel to overlap the transmission region to form a resin coating layer;
    pressing the resin coating layer in a thickness direction of the display panel;
    curing the resin coating layer; and
    removing the release film.

19. The method of claim 18, wherein the pressing of the resin coating layer is pressing the resin coating layer using a stamp coated with a release material.

20. A display device comprising:
    a display panel including a transmission region through which light passes and a light blocking region adjacent to the transmission region; and
    a window disposed on the display panel,
    wherein the window includes:
        a resin layer including an upper surface spaced apart from the display panel;
        a light blocking pattern disposed between the display panel and the resin layer and overlapping the light blocking region; and
        a residual release material disposed on the upper surface of the resin layer.

* * * * *